(12) United States Patent
Tagaeto et al.

(10) Patent No.: US 8,913,760 B2
(45) Date of Patent: Dec. 16, 2014

(54) SOUND REPRODUCING DEVICE, REPRODUCED SOUND ADJUSTMENT METHOD, ACOUSTIC CHARACTERISTIC ADJUSTMENT DEVICE, ACOUSTIC CHARACTERISTIC ADJUSTMENT METHOD, AND COMPUTER PROGRAM

(71) Applicant: JVC Kenwood Corporation, Yokohama (JP)

(72) Inventors: Tetsuo Tagaeto, Yokohama (JP); Hiroyuki Takeishi, Yokohama (JP); Kenji Tokunaga, Yokohama (JP)

(73) Assignee: JVC Kenwood Corporation, Yokohama-shi, Kanagawa (JP)

( * ) Notice: Subject to any disclaimer, the term of this patent is extended or adjusted under 35 U.S.C. 154(b) by 0 days.

(21) Appl. No.: 13/917,215

(22) Filed: Jun. 13, 2013

(65) Prior Publication Data

US 2013/0279707 A1 Oct. 24, 2013

Related U.S. Application Data

(63) Continuation of application No. PCT/JP2011/074933, filed on Oct. 28, 2011.

(30) Foreign Application Priority Data

Dec. 14, 2010 (JP) .................................. 2010-278338
Jan. 21, 2011 (JP) .................................. 2011-010430

(51) Int. Cl.
*H03G 3/00* (2006.01)
(Continued)

(52) U.S. Cl.
CPC ................. *H04R 3/00* (2013.01); *H03G 9/025* (2013.01); *H04S 7/307* (2013.01); *H04S 3/002* (2013.01); *H03G 5/165* (2013.01); *H04S 2400/13* (2013.01)
USPC ............................ 381/104; 381/109; 381/107

(58) Field of Classification Search
USPC ........... 381/98, 102, 103, 104, 107, 109, 119, 381/57, 58, 60; 700/94; 704/272, 278
See application file for complete search history.

(56) References Cited

U.S. PATENT DOCUMENTS 3,732,370 A 5/1973 Sacks
4,118,601 A 10/1978 Yeap

FOREIGN PATENT DOCUMENTS

EP 1887687 A1 2/2008
JP 05-206772 A 8/1993
(Continued)

OTHER PUBLICATIONS

European Search Report dated Jul. 24, 2014 corresponding to application No. 11847927.8-1810/2665293 PCT/JP2011074933.

*Primary Examiner* — Xu Mei
*Assistant Examiner* — Ammar Hamid
(74) *Attorney, Agent, or Firm* — Nath, Goldberg & Meyer; Jerald L. Meyer; Stanley N. Protigal

(57) ABSTRACT

A sound reproducing device having: a sound source data storage unit configured to store reference sound source data for reproducing a reference sound having a prescribed frequency band and comparative sound source data for reproducing comparative sounds having frequency bands different from each other; a reproduction processing unit configured to reproduce the reference sound and the comparative sounds on the basis of the reference sound source data and the comparative sound source data stored in the sound source data storage unit; a comparative sound volume adjustment operation unit configured to receive sound volume adjustment operation for the comparative sounds; and an acoustic characteristic information generation unit configured to simultaneously output the reference sound and a comparative sound of a sound volume in accordance with the received sound volume adjustment operation and record a result of the sound volume adjustment operation in association with the comparative sound related to reproduction.

15 Claims, 14 Drawing Sheets

(51) Int. Cl.

*H04R 3/00* (2006.01)
*H03G 9/02* (2006.01)
*H03G 5/16* (2006.01)
*H04S 7/00* (2006.01)
*H04S 3/00* (2006.01)

(56) References Cited

FOREIGN PATENT DOCUMENTS

| | | |
|---|---|---|
| JP | 09-027996 A | 1/1997 |
| JP | 2000-270392 A | 9/2000 |
| JP | 2004-260550 A | 9/2004 |
| WO | 2009-057488 A1 | 5/2009 |

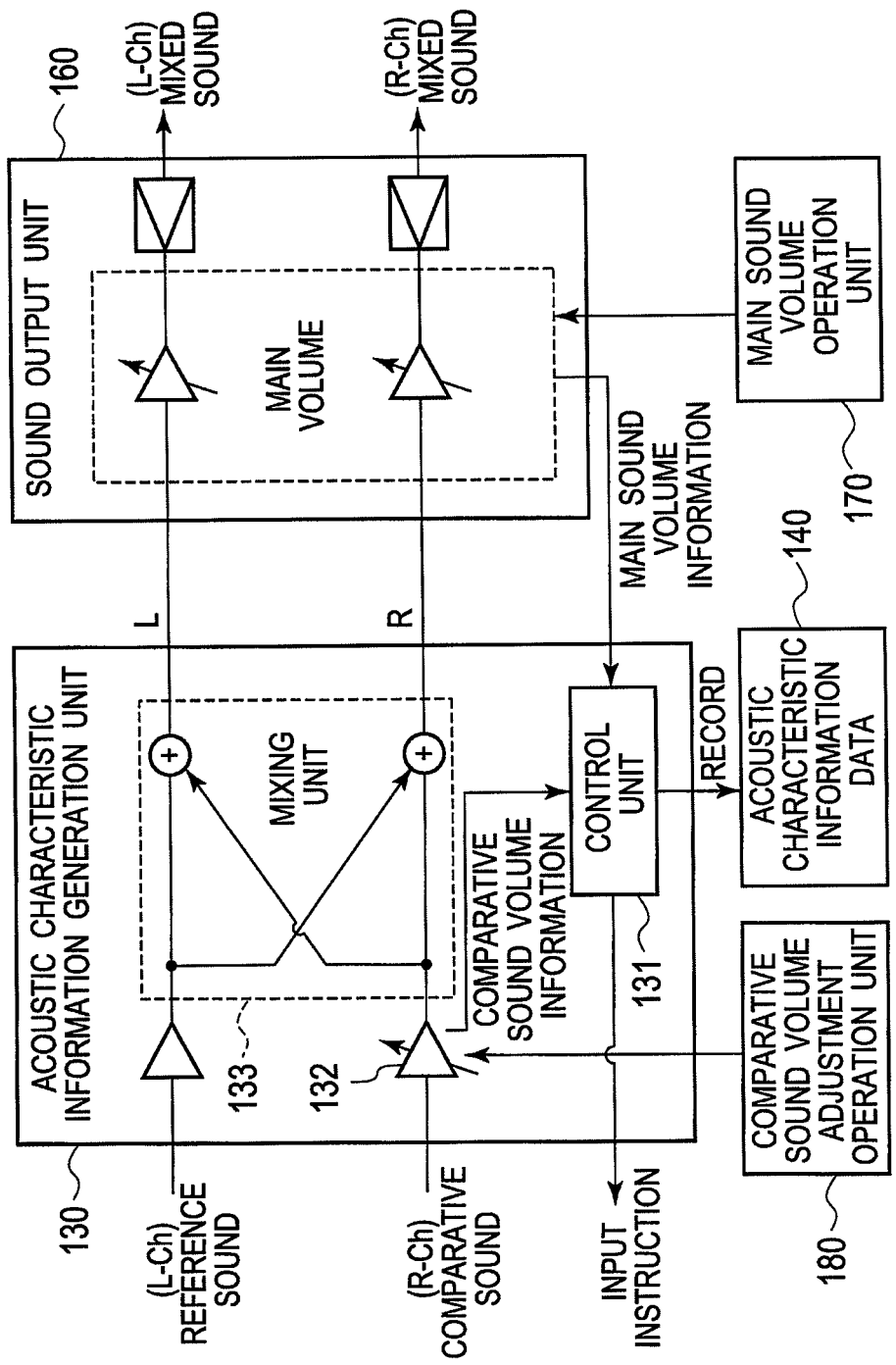

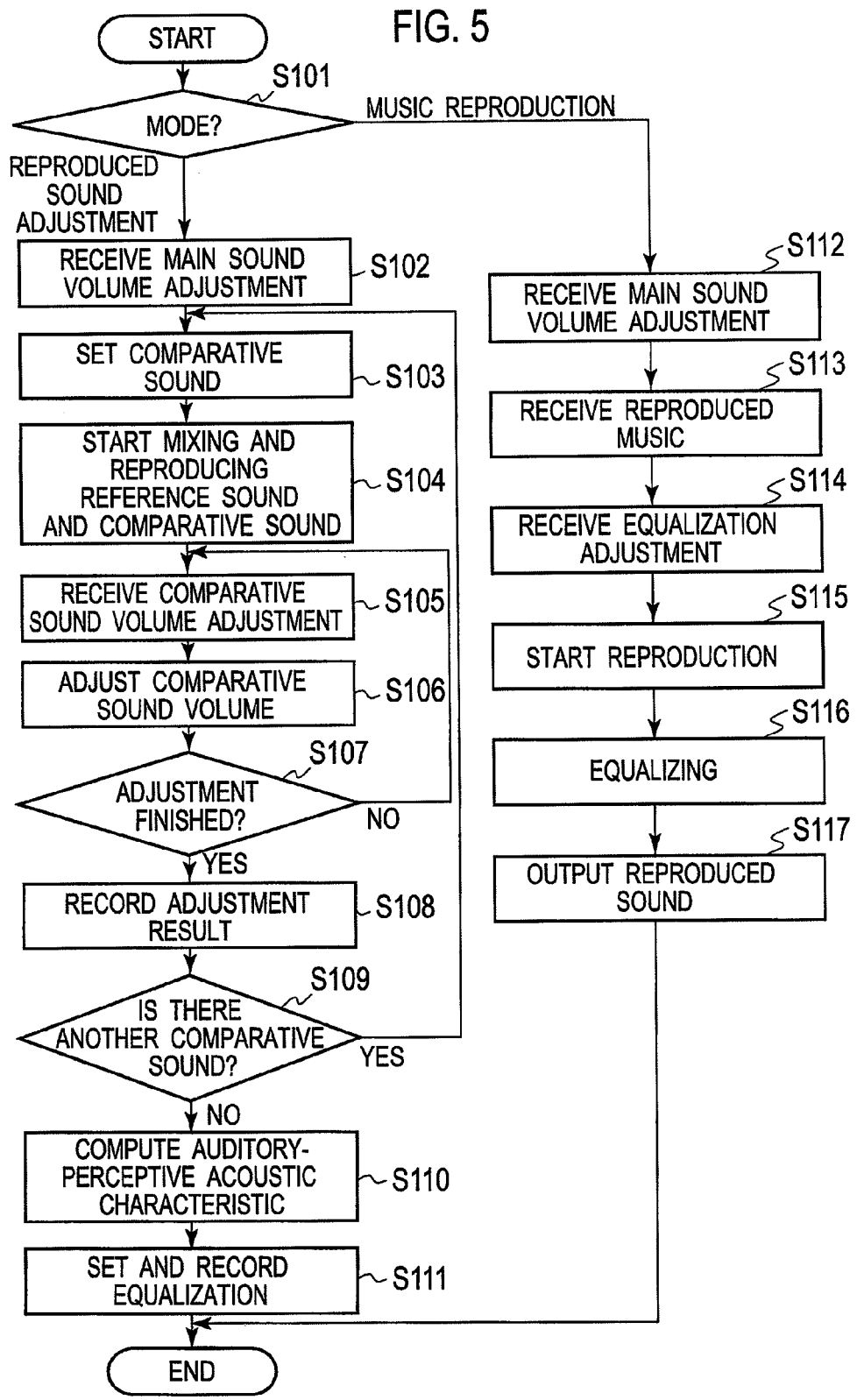

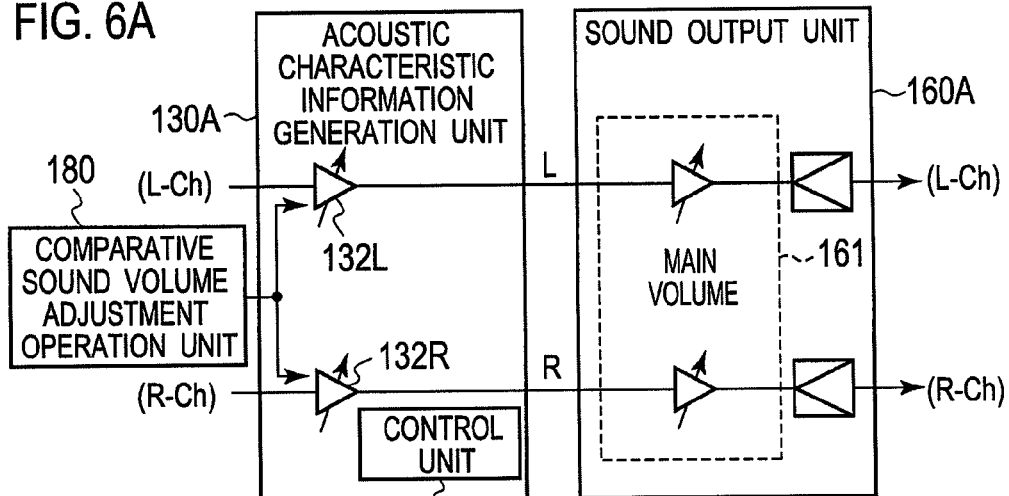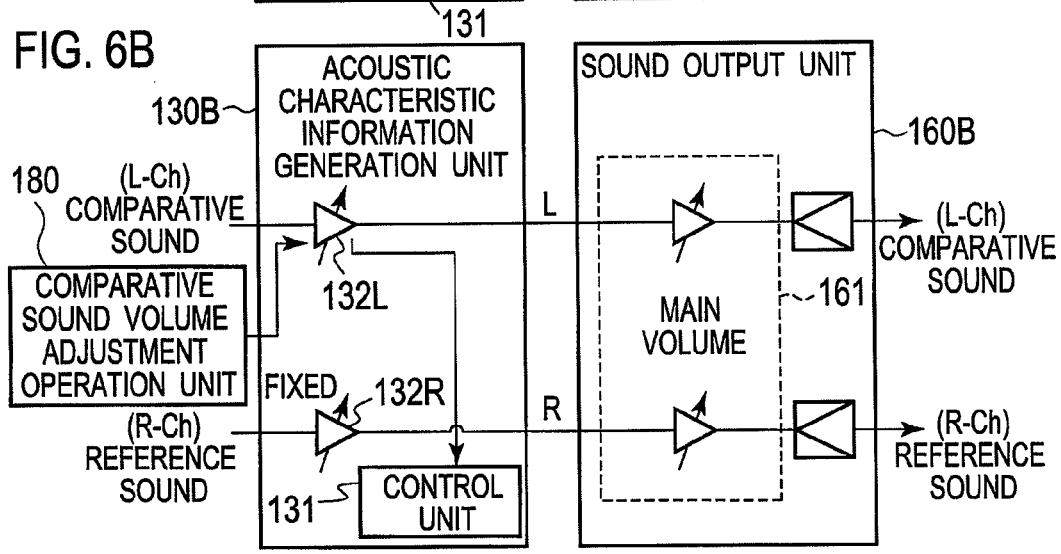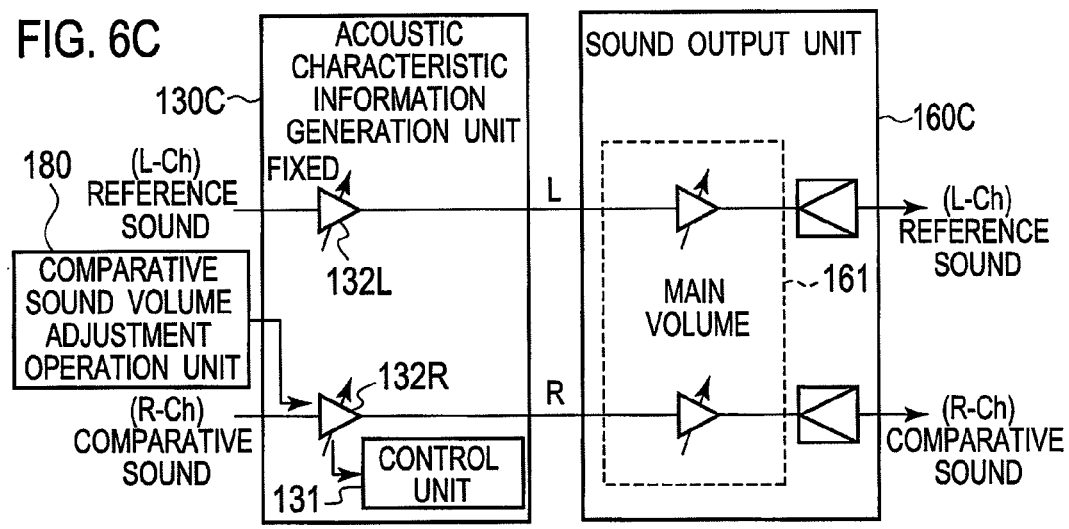

FIG. 13

|  | LOW-TONE RANGE | MIDDLE-LOW-TONE RANGE | MIDDLE-TONE RANGE | MIDDLE-HIGH-TONE RANGE | HIGH-TONE RANGE |
|---|---|---|---|---|---|
| LOW-TONE RANGE | 0.00 | −0.30 | −0.45 | −0.55 | −0.30 |
| MIDDLE-LOW-TONE RANGE | +0.30 | 0.00 | −0.15 | −0.25 | 0.00 |
| MIDDLE-TONE RANGE | +0.45 | +0.15 | 0.00 | −0.10 | +0.15 |
| MIDDLE-HIGH-TONE RANGE | +0.55 | +0.25 | +0.10 | 0.00 | +0.25 |
| HIGH-TONE RANGE | +0.30 | 0.00 | 0.15 | −0.25 | 0.00 |

FIG. 14

|  |  | OPERATION VALUE WEIGHT VALUE | AVERAGE DIFFERENCE WEIGHT VALUE | REFERENCE CHARACTERISTIC DIFFERENCE COEFFICIENT | | | | | REFERENCE CHARACTERISTIC WEIGHT VALUE | INVESTIGATION RESULT WEIGHT VALUE |
|---|---|---|---|---|---|---|---|---|---|---|
|  |  |  |  | LOW TONE | MIDDLE-LOW TONE | MIDDLE TONE | MIDDLE-HIGH TONE | HIGH TONE |  |  |
|  | n | A(n) | B(n) | C(n) | D(n) | E(n) | F(n) | G(n) | H(n) | I(n) |
| LOW-TONE RANGE | 1 | 0.40 | 0.40 | 0 | 0.30 | 0.45 | 0.55 | 0.30 | 0.20 | 1.00 |
| MIDDLE-LOW-TONE RANGE | 2 | 0.40 | 0.40 | −0.30 | 0 | 0.15 | 0.25 | 0.00 | 0.20 | 1.00 |
| MIDDLE-TONE RANGE | 3 | 0.40 | 0.40 | −0.45 | −0.15 | 0 | 0.10 | −0.15 | 0.20 | 1.00 |
| MIDDLE-HIGH-TONE RANGE | 4 | 0.40 | 0.40 | −0.55 | −0.25 | −0.10 | 0 | −0.25 | 0.20 | 1.00 |
| HIGH-TONE RANGE | 5 | 0.40 | 0.40 | −0.30 | 0.00 | 0.15 | 0.25 | 0 | 0.20 | 1.00 |

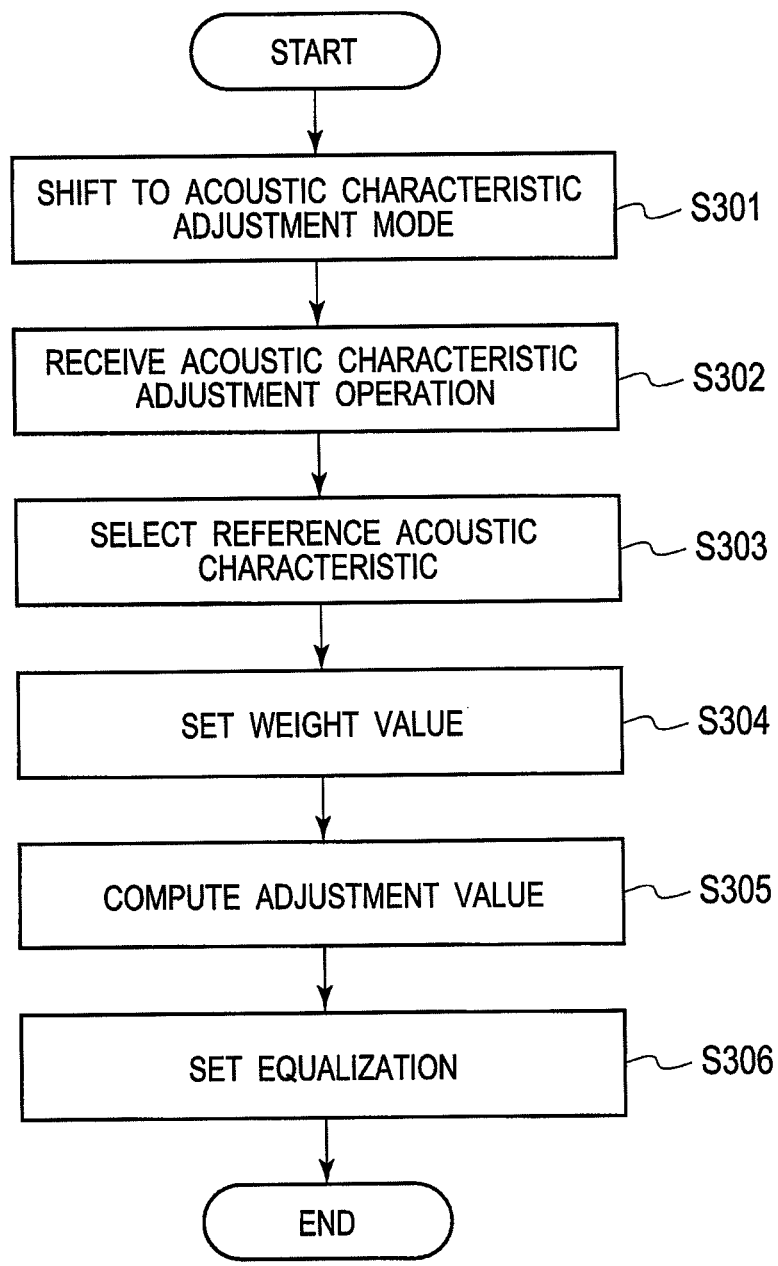

SOUND REPRODUCING DEVICE, REPRODUCED SOUND ADJUSTMENT METHOD, ACOUSTIC CHARACTERISTIC ADJUSTMENT DEVICE, ACOUSTIC CHARACTERISTIC ADJUSTMENT METHOD, AND COMPUTER PROGRAM

CROSS REFERENCE TO RELATED APPLICATION

This application is a Continuation of PCT Application No. PCT/JP2011/074933, filed on Oct. 28, 2011, and claims the priority of Japanese Patent Application No. 2010-278338, filed on Dec. 14, 2010, and No. 2011-010430, filed on Jan. 21, 2011, the content of both of which is incorporated herein by reference.

BACKGROUND

The present invention relates to a sound reproducing device, a reproduced sound adjustment method, an acoustic characteristic adjustment device, an acoustic characteristic adjustment method, and a computer program. More specifically, the present invention relates to a sound reproducing device and a reproduced sound adjustment method of performing adjustments of reproduced sound appropriate for individual users. Furthermore, the present invention relates to an acoustic characteristic adjustment device, an acoustic characteristic adjustment method, and a computer program, which make it possible to obtain reproduced sound having a good acoustic characteristic while an acoustic characteristic adjustment result received by user operation is taken into consideration.

In many cases, a sound reproducing device has an equalization function. An equalization function is used for: smoothing an auditory-perceptive acoustic characteristic by adjusting a frequency characteristic of reproduced sound; clarifying a sound image by emphasizing a specific frequency band, and the like. Furthermore, it is also used for obtaining a loudness effect of realizing a uniform auditory sensation by enhancing a low-tone range and a high-tone range at a small sound volume.

As an equalization function, a function of classifying a reproduced sound range into a plurality of sound ranges such as, for example, a low-tone range, a middle-low-tone range, a middle-tone range, a middle-high-tone range, and a high-tone range and arbitrarily setting the degrees of emphasis and reduction for each of the sound ranges and a function of selecting a frequency characteristic preset in accordance with a genre, a surrounding environment, user attribution such as age, and the like are practically used.

Meanwhile, a listening environment and the auditory sense of a user vary, and thus the frequency characteristic of a sound output from a sound reproducing device do not always coincide with an auditory-perceptive acoustic characteristic. For example, even when a sound reproducing device outputs a sound of a flat frequency characteristic, it sometimes happens that a specific sound range is heard in an emphasized manner or a specific sound range is heard in a weakened manner depending on a listening environment or the auditory sense of a user. Therefore, in recent years, reproduced sound has been equalized on the basis of an auditory-perceptive acoustic characteristic in order to enhance the functionality of an equalizer.

Auditory-perceptive acoustic characteristics have heretofore been adjusted by: alternately reproducing a comparative sound having a frequency band to be inspected and a reference sound having a frequency band wider than the above frequency band; and adjusting the sound volume of the comparative sound so that the comparative sound may be heard by a user as the same sound volume as the reference sound.

It is possible to obtain acoustically flat frequency characteristics for a user by: reproducing a sound in an emphasized manner because it sounds weak for a user in a frequency band where the sound volume of a comparative sound is increased so as to be higher than a prescribed level in adjustment; and reproducing a sound in a weakened manner because it sounds strong for a user in a frequency band where the sound volume of a comparative sound is decreased so as to be lower than a prescribed level in adjustment.

It is possible to enjoy audio reproduction more consistent with the preference or intention of a user by applying equalization desired by the user with reference to such an auditory-perceptive flat frequency characteristic (see Japanese Patent Application Laid-Open Publication No. H05 (1993)-206772 and Japanese Patent Application Laid-Open Publication No. H09 (1997)-027996, for example).

A method of reproducing a comparative sound and a reference sound alternately and adjusting the sound volume of the comparative sound so that the comparative sound may be heard as the same sound volume as the reference sound is, however, not an easy operation for a user and tends to be inaccurate since it relies on the memory of sound. In addition, a process of trial and error has to be repeated in order to compare the sound volumes and it is concerned that much time is required for reproduced sound adjustment operation.

Further, when a user adjusts an acoustic characteristic arbitrarily, it may sometimes happen that respective adjusted values in sound ranges vary extremely. An example is the case where, whereas the sound volumes of comparative sounds in a low-tone range, a middle-low-tone range, and a high-tone range are enhanced to the maximum scale value of +10, the sound volume of a comparative sound in a middle-high-tone range is reduced to the minimum scale value of −10 as shown in FIG. 1A.

If a reproduced sound is equalized on the basis of such an adjustment result, a reproduced sound having such an frequency characteristic as shown in FIG. 1B is obtained and unnatural music having an acoustic characteristic not intended by a sound source producer is undesirably provided to a user.

Furthermore, it is considered that such an extreme adjustment result is caused by inexperienced operation or faulty operation by a user in many cases. Consequently, if a sound having an acoustic characteristic obtained through the operation result by a user is directly reproduced, the user listens to music reproduced with an unanticipated frequency characteristic and the music becomes rather unpleasant to listen to because of the acoustic characteristic adjustment. On the other hand, if an adjustment result received by user operation is treated lightly, it means that the original purpose of equalization function is abandoned.

SUMMARY

In view of the above technological problems, an object of the present invention is to provide a sound reproducing device and a reproduced sound adjustment method of performing adjustments of reproduced sound appropriate for individual users. Further, another object of the present invention is to provide an acoustic characteristic adjustment device, an acoustic characteristic adjustment method, and a computer program, which make it possible to obtain reproduced sound having a good acoustic characteristic while an acoustic characteristic adjustment result received by user operation is taken into consideration.

In order to solve the above problems, the present invention provides a sound reproducing device including: a sound source data storage unit configured to store reference sound source data for reproducing a reference sound having a prescribed frequency band and comparative sound source data for reproducing comparative sounds having frequency bands different from each other; a reproduction processing unit configured to reproduce the reference sound and the comparative sounds on the basis of the reference sound source data and the comparative sound source data stored in the sound source data storage unit; a comparative sound volume adjustment operation unit configured to receive sound volume adjustment operation for the comparative sounds; and an acoustic characteristic information generation unit configured to simultaneously output the reference sound and a comparative sound of a sound volume in accordance with the received sound volume adjustment operation and record a result of the sound volume adjustment operation in association with the comparative sound related to reproduction.

In order to solve the above problems, the present invention provides a reproduced sound adjustment method including: a sound source data storage step of storing reference sound source data for reproducing a reference sound having a prescribed frequency band and comparative sound source data for reproducing comparative sounds having frequency bands different from each other; a reproduction processing step of reproducing the reference sound and the comparative sounds; a comparative sound volume adjustment operation step of receiving sound volume adjustment operation for the comparative sounds; and an acoustic characteristic information generation step of simultaneously outputting the reference sound and a comparative sound having a sound volume in accordance with the received sound volume adjustment operation and recording a result of the sound volume adjustment operation in association with the comparative sound related to reproduction.

In order to solve the above problems, the present invention provides an acoustic characteristic adjustment device including: an adjustment operation reception unit configured to receive an operation adjustment value of emphasis or reduction in each of a plurality of divided sound ranges; and an acoustic characteristic adjustment unit configured, in each of the divided sound ranges, to compute an adjustment value from an operation adjustment term computed on the basis of an operation adjustment value in a sound range, an average difference term computed on the basis of a difference between the operation adjustment value in the sound range and an average value of operation adjustment values in all the sound ranges, and a reference acoustic characteristic term computed on the basis of a sum of values, each of which is obtained by multiplying each difference between the operation adjustment value in the sound range and another operation adjustment value in another sound range by each difference coefficient obtained from a prescribed reference acoustic characteristic.

In order to solve the above problems, the present invention provides an acoustic characteristic adjustment method including: an adjustment operation reception step of receiving an operation adjustment value of emphasis or reduction in each of a plurality of divided sound ranges; and an acoustic characteristic adjustment step, in each of the divided sound ranges, of computing an adjustment value from an operation adjustment term computed on the basis of an operation adjustment value in a sound range, an average difference term computed on the basis of a difference between the operation adjustment value in the sound range and an average value of operation adjustment values in all the sound ranges, and a reference acoustic characteristic term computed on the basis of a sum of values, each of which is obtained by multiplying each difference between the operation adjustment value in the sound range and another operation adjustment value in another sound range by each difference coefficient obtained from a prescribed reference acoustic characteristic.

In order to solve the above problems, the present invention provides a computer program causing an information processing device to function as: an adjustment operation reception unit configured to receive an operation adjustment value of emphasis or reduction in each of a plurality of divided sound ranges; and an acoustic characteristic adjustment unit configured, in each of the divided sound ranges, to compute an adjustment value from an operation adjustment term computed on the basis of an operation adjustment value in a sound range, an average difference term computed on the basis of a difference between the operation adjustment value in the sound range and an average value of operation adjustment values in all the sound ranges, and a reference acoustic characteristic term computed on the basis of a sum of values, each of which is obtained by multiplying each difference between the operation adjustment value in the sound range and another operation adjustment value in another sound range by each difference coefficient obtained from a prescribed reference acoustic characteristic.

The present invention makes it possible to provide a sound reproducing device and a reproduced sound adjustment method of performing adjustments of reproduced sound appropriate for individual users. Further, the present invention makes it possible to provide an acoustic characteristic adjustment device, an acoustic characteristic adjustment method, and a computer program, which make it possible to obtain reproduced sound having a good acoustic characteristic while an acoustic characteristic adjustment result received by user operation is taken into consideration.

BRIEF DESCRIPTION OF THE DRAWINGS

FIG. 4 is a block diagram explaining the configuration of an acoustic characteristic information generation unit according to the first embodiment in the present invention.

FIG. 5 is a flowchart explaining the operation of a sound reproducing device according to the first embodiment in the present invention.

FIGS. 6A to 6C are block diagrams explaining the configuration of an acoustic characteristic information generation unit according to a first modified example of the first embodiment in the present invention.

FIG. 13 is a table showing an example of coefficients set on the basis of respective differences between a sound range and other sound ranges in the standard characteristic of loudness shown in FIG. 12.

FIG. 14 is a table showing an example of the values of parameters according to the second embodiment in the present invention.

FIG. 16 is a flowchart explaining acoustic characteristic adjustment procedures in an acoustic characteristic adjustment device according to the second embodiment in the present invention.

DETAILED DESCRIPTION

First Embodiment

Figure 1A:
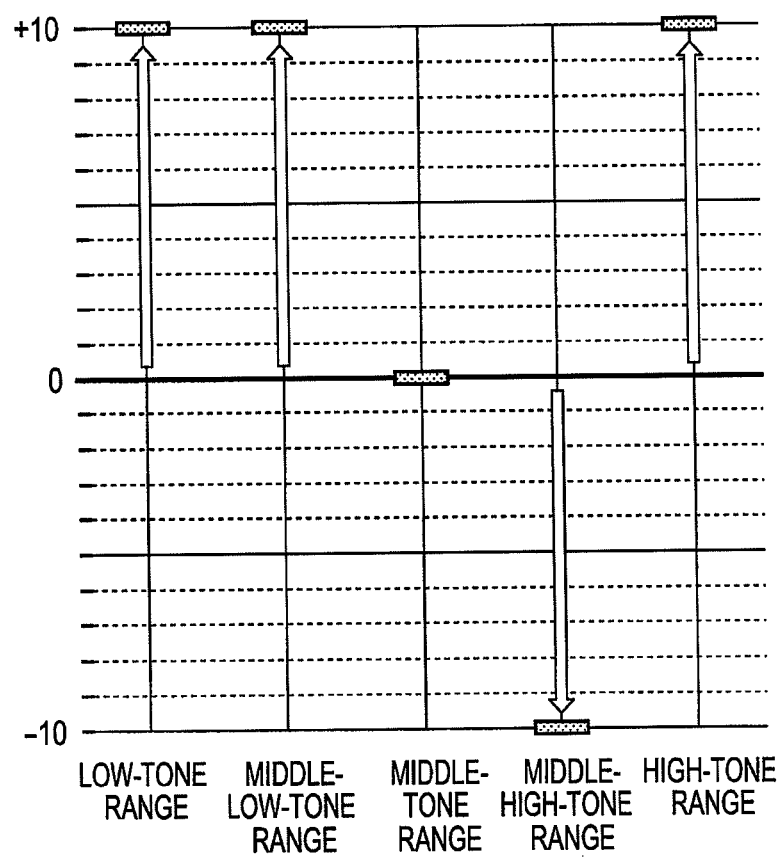
FIGS. 1A and 1B are views showing the relationship between a conventional example of an adjustment result based on user operation and a frequency characteristic of reproduced sound based on the adjustment result.
Figure 1B:
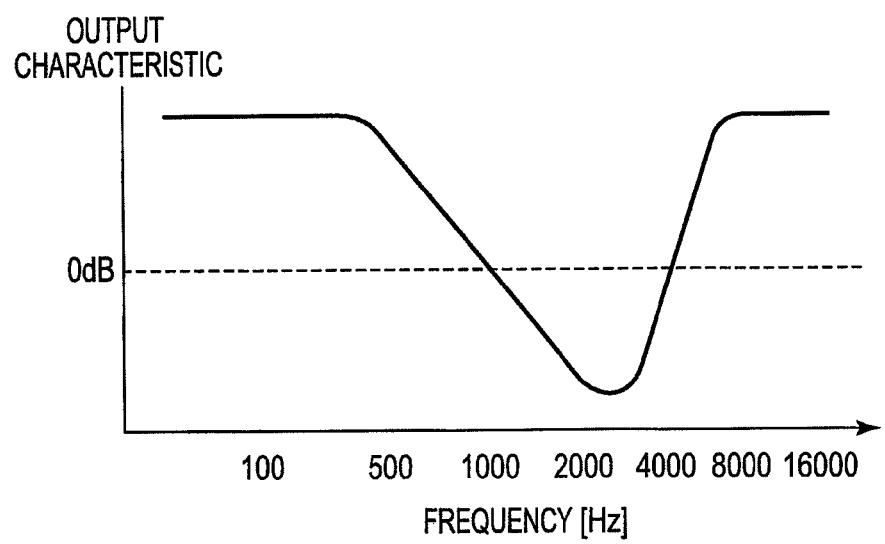
Figure 2:
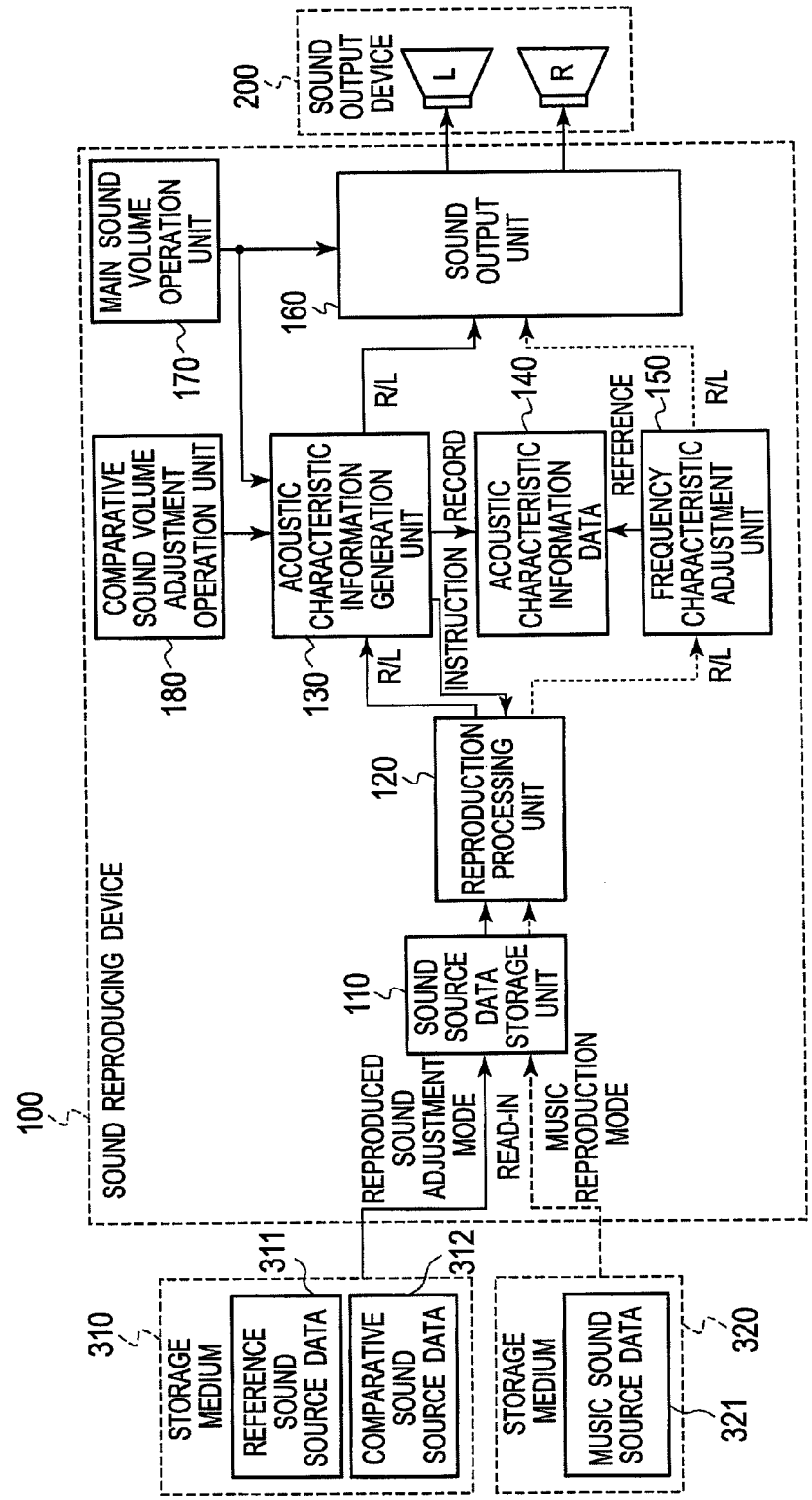
FIG. 2 is a block diagram showing the configuration of a sound reproducing device according to the first embodiment in the present invention.

The first embodiment according to the present invention is explained in detail in reference to FIG. 2 to FIG. 10. FIG. 2 is a block diagram showing the configuration of a sound reproducing device according to the present embodiment. A sound reproducing device is a device that: reads and reproduces sound source data recorded in a storage medium; and outputs an audio signal to a sound output device such as a speaker, a headphone, or the like, an amplifier, or the like. A sound reproducing device according to the present embodiment can be applied to various acoustic devices including a stationary acoustic device, a portable reproducing device, an in-vehicle audio device, a PC equipped with sound source regenerative function, and the like.

As shown in FIG. 2, a sound reproducing device 100 has a sound source data storage unit 110, a reproduction processing unit 120, an acoustic characteristic information generation unit 130, acoustic characteristic information data 140, a frequency characteristic adjustment unit 150, a sound output unit 160, a main sound volume operation unit 170, and a comparative sound volume adjustment operation unit 180.

The sound source data storage unit 110 is a storage region to read sound source data from a storage medium and store the sound source data. As the storage medium, a CD, a DVD, an HDD (Hard Disc Drive), a semiconductor memory, or the like can be used and it may be either detachable and portable or incorporated in the sound reproducing device 100. Otherwise, the sound source data storage unit 110 may: read sound source data from another reproducing device via a cable or the like; or read sound source data wirelessly like a radio, an FM transmitter, or the like.

In the present embodiment, the sound source data storage unit 110 reads sound source data from a storage medium 310 which stores reference sound source data 311 and comparative sound source data 312 in addition to a storage medium 320 which stores ordinary music sound source data 321. The reference sound source data 311 and the comparative sound source data 312 are sound source data used when reproduced sound is adjusted. The reference sound source data 311 and the comparative sound source data 312 may be stored also in the sound source data storage unit 110 in a nonvolatile manner.

The reference sound source data 311 are sound source data for reproducing a reference sound having a prescribed frequency band. The comparative sound source data 312 are sound source data for reproducing a plurality of comparative sounds having frequency bands different from each other. A reference sound desirably has a frequency band different from the frequency band of any of the comparative sounds so as to be clearly identified from the comparative sounds.

Figure 3A:
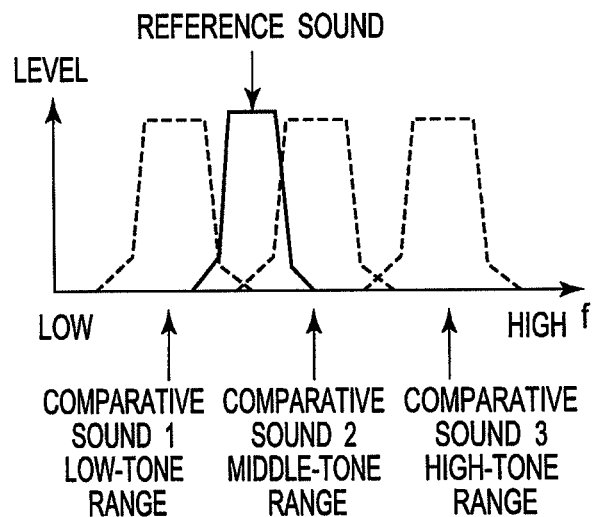
FIGS. 3A and 3B are views showing examples of the relationship between a reference sound and plural comparative sounds according to the first embodiment in the present invention.
Figure 3B:
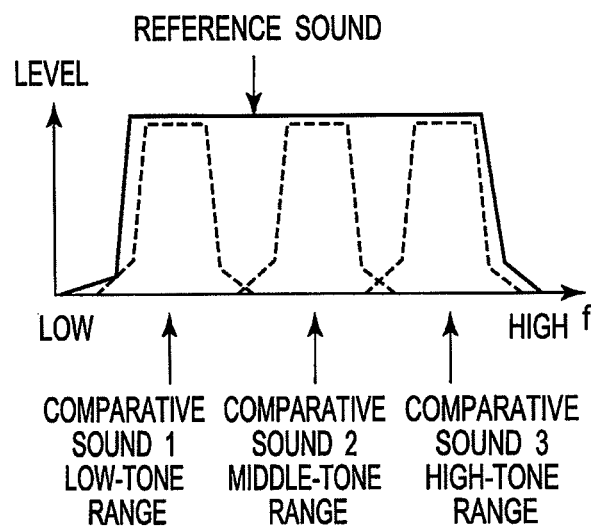

FIGS. 3A and 3B are views showing examples of the relationship between a reference sound and plural comparative sounds. FIG. 3A shows the case where a sound having a specific frequency band in a middle-low-tone range is used as a reference sound, a sound having a specific frequency band in a low-tone range is used as a comparative sound 1, a sound having a specific frequency band in a middle-tone range is used as a comparative sound 2, and a sound having a specific frequency band in a high-tone range is used as a comparative sound 3.

As the bands of the comparative sounds, it is desirable to set a plurality of bands over a reproduced sound range because the bands correspond to the frequency bands to be used when reproduced sound is adjusted. Further, it is desirable that the bands of the comparative sounds correspond to frequency bands which can be adjusted independently by the frequency characteristic adjustment unit 150 that will be described later. For example, when the frequency characteristic adjustment unit 150 can adjust a characteristic for each of a low-tone range, a middle-low-tone range, a middle-tone range, a middle-high-tone range, and a high-tone range, comparative sounds are prepared for the low-tone range, the middle-low-tone range, the middle-tone range, the middle-high-tone range, and the high-tone range, respectively.

FIG. 3B shows the case where a sound having a wide frequency band ranging from a low-tone range to a high-tone range is used as the reference sound. The comparative sounds are similar to those shown in FIG. 3A.

Although it is possible to use a white noise as a reference sound or electronic sounds as both a reference sound and comparative sounds, instrumental sounds are used as both a reference sound and comparative sounds in the present embodiment. For example, by using a sound of a drum set having a wide frequency band as a reference sound, a sound of a base as a comparative sound 1 in a low-tone range, a sound of a piano as a comparative sound 2 in a middle-tone range, and a cymbal for a comparative sound 3 in a high-tone range, it is possible to emphasize musicality and rouse the interest of a user more than the case of using electronic sounds.

Here, it is also possible to make a reference sound and comparative sounds changeable. By making a reference sound and comparative sounds changeable, it is possible to set a sound of a piano in a middle-tone range as a reference sound when a user wants to adjust a sound in another range on the basis of a sound of a piano in a middle-tone range for example. Otherwise, it is also possible to change them randomly or change them in accordance with a prescribed rule on the side of the sound reproducing device 100.

A mode of carrying out processing of reading the reference sound source data 311 and the comparative sound source data 312 from a storage medium 310 and adjusting reproduced sound is referred to as a "reproduced sound adjustment mode" and a mode of carrying out processing of reading the ordinary music sound source data 321 from the storage medium 320 and reproducing sound is referred to as a "music reproduction mode" hereunder. In the "music reproduction mode", it is possible to reproduce sound by applying an arbitrary equalization processing in accordance with preference of a user.

The reproduction processing unit 120 carries out reproduction processing of sound source data stored in the sound source data storage unit 110. In the reproduced sound adjustment mode, a reference sound and any of comparative sounds are reproduced simultaneously on the basis of the reference sound source data 311 and the comparative sound source data 312 stored in the sound source data storage unit 110.

At this time, the reproduction processing unit 120 reproduces the reference sound source data 311 from a left channel and the comparative sound source data 312 from a right channel for example. By so doing, sound volume adjustment only for a comparative sound can be easily carried out with a configuration similar to that of a conventional two-channel sound reproducing device.

Here, although the reproduction processing unit 120 carries out two-channel stereo reproduction of right and left channels in the present embodiment, it is also possible to carry out multichannel reproduction including 5.1 channels, or the like. At this time too, the reference sound source data 311 and the comparative sound source data 312 are reproduced through different channels.

The comparative sound volume adjustment operation unit 180 receives sound volume adjustment operation for a comparative sound from a user in the reproduced sound adjustment mode. The main sound volume operation unit 170 is a so-called main volume and receives sound volume adjustment operation for changing a sound volume in a right channel and a sound volume in a left channel in conjunction with each other. In the reproduced sound adjustment mode, sound volume adjustment operation for changing sound volumes of a reference sound and a comparative sound in conjunction with each other is received.

The acoustic characteristic information generation unit 130, in the reproduced sound adjustment mode: simultaneously outputs a reference sound and a comparative sound having a sound volume complying with the sound volume adjustment operation received by the comparative sound volume adjustment operation unit 180 to the sound output unit 160; and records the result of the sound volume adjustment operation as the acoustic characteristic information data 140 in correspondence to a comparative sound related to reproduction. At this time, auditory-perceptive acoustic characteristics change in response to a main sound volume, and thus the sound volume of the main sound volume operation unit 170 may further be recorded in correspondence.

In this way, in the present embodiment, a user can easily judge the sound volume of a comparative sound by outputting a reference sound and the comparative sound simultaneously. That is, a user can listen to a reference sound and a comparative sound simultaneously, and thus can easily judge whether or not the reference sound and the comparative sound have the same sound volume. Further, since a user is not required to listen to a reference sound and a comparative sound alternately, it is possible to reduce the time spent in/with the adjustment operation of reproduced sound.

The frequency characteristic adjustment unit 150 computes an auditory-perceptive acoustic characteristic in reference to the acoustic characteristic information data 140. That is, it computes an auditory-perceptive acoustic characteristic for each frequency band on the basis of the frequency band of each of the comparative sounds and a sound volume adjustment result by a user. Further, in the music reproduction mode, the frequency characteristic adjustment unit 150 receives equalization adjustment from a user and changes the frequency characteristic of reproduced sound and outputs it to the sound output unit 160 on the basis of the received adjustment content and the auditory-perceptive acoustic characteristic computed in reference to the acoustic characteristic information data 140.

When equalization adjustment by which sound is reproduced by a flat characteristic is received from a user in the music reproduction mode for example, the reproduced sound is equalized so as to have a flat frequency characteristic on the basis of an auditory-perceptive acoustic characteristic. Then, when the instructions of loudness are received from a user, the reproduced sound is equalized so as to have a frequency characteristic of emphasizing the low-tone range and the high-tone range of the reproduced sound on the basis of an auditory-perceptive acoustic characteristic.

The sound output unit 160 outputs an audio signal of a sound volume complying with the operation content received by the main sound volume operation unit 170 to a sound output device 200 such as a speaker. Although the sound output device 200 has two channels in the present embodiment, multichannel may be adopted in correspondence to the reproduction processing unit 120. Otherwise, a multiway speaker system having plural units for each channel may be adopted.

Here, although it is assumed to output sound source data of a digital format to the sound output device 200 in an analog format in the present embodiment, it is also possible to use sound source data of an analog format or to output sound source data to the sound output device 200 in a digital format. Further, conversion from a digital format to an analog format may be carried out at the reproduction processing unit 120 or the sound output unit 160. In the former case, sound volume adjustment is applied to a comparative sound signal of an analog format and, in the latter case, sound volume adjustment is applied to a comparative sound signal of a digital format and successively conversion to an analog format is applied.

The configuration of the acoustic characteristic information generation unit 130 is explained hereunder in reference to FIG. 4. In the present embodiment, in the reproduced sound adjustment mode, a reference sound is input from a left channel, a comparative sound is input from a right channel, and sound volume adjustment complying with operation received by the comparative sound volume adjustment operation unit 180 is applied to the comparative sound in the right channel with a sound volume adjustment unit 132.

At this time, the reference sound source data 311 and the comparative sound source data 312 can be treated as a file recording the reference sound in the left channel and the comparative sound in the right channel. Furthermore, plural comparative sounds may be recorded continuously in a file or may be partitioned with tracks. It goes without saying that a comparative sound may be input from a left channel and a reference sound may be input from a right channel.

In this way, by inputting a reference sound from a left channel and a comparative sound from a right channel in the acoustic characteristic information generation unit 130 for example, it comes to be possible to apply the present invention without changing the configuration largely from a conventional ordinary two-channel sound reproducing device.

Then the acoustic characteristic information generation unit 130 mixes the reference sound and the comparative sound after sound volume adjustment through a mixing unit 133 and outputs the mixture to the sound output unit 160. As a result, an identical mixed sound is output from both the right channel and the left channel. In the case of a multichannel too, an identical mixed sound is output from all the channels.

The acoustic characteristic information generation unit 130 has a control unit 131. The control unit 131, in the reproduced sound adjustment mode, inputs a comparative sound to be inspected into the acoustic characteristic information generation unit 130 in accordance with a prescribed sequence and receives sound volume operation for the comparative sound to be inspected from a user.

At this time, it is desirable that the comparative sound volume adjustment operation unit 180 induces a user to adjust the sound volume of the comparative sound so as to be able to listen to the comparative sound and the reference sound at an identical sound volume in order to support the operation by the user. Examples of an induction method are a method of displaying operation procedures on a display device not shown in the figure and a method of notifying operation procedures by voice.

Furthermore, when sound volume adjustment of a comparative sound to be inspected by a user is finished, the control unit 131 records a sound volume adjustment result in the acoustic characteristic information data 140 in correspondence to the comparative sound. Otherwise, the control unit 131 may directly notify a sound volume adjustment result to the frequency characteristic adjustment unit 150 and record the result. Correspondence to a comparative sound can be carried out by recording an identifier of a comparative sound or recording the result in accordance with the reproduction sequence of comparative sounds for example.

Operations of the sound reproducing device 100 are explained hereunder in reference to FIG. 5. In the flowchart, operations in a reproduced sound adjustment mode and operations in a music reproduction mode are explained separately. With regard to the distinction of a mode, the sound reproducing device 100 is operated in the music reproduction mode usually and shifts to the reproduced sound adjustment mode when a user instructs reproduced sound adjustment or in default setting for example.

First, in the reproduced sound adjustment mode (S101: reproduced sound adjustment), adjustment of a main sound volume is received by the main sound volume operation unit 170 (S102). It is desirable to set the main sound volume at a sound volume used when a user listens ordinarily. This is because an auditory-perceptive acoustic characteristic changes in response to the main sound volume.

Then the control unit 131 reads the reference sound source data 311 and the comparative sound source data 312 from a storage medium 310 into the sound source data storage unit 110 and sets a comparative sound to be inspected in accordance with a predetermined inspection sequence (S103). The inspection sequence can be set so as to start from a comparative sound in a low-tone range and gradually shift to a comparative sound in a higher-tone range for example.

When a comparative sound to be inspected is set, the reproduction processing unit 120 starts the reproduction of a reference sound and the comparative sound, the acoustic characteristic information generation unit 130 mixes the reference sound and the comparative sound, and the sound output unit 160 outputs the mixed sound data (S104). As a result, an identical sound produced by mixing the reference sound and the comparative sound is output from all the channels of the sound output device 200.

A user listens to the mixed sound and operates the comparative sound volume adjustment operation unit 180 so as to be able to listen to the comparative sound and the reference sound at an identical sound volume. At this time, as stated above, it is desirable that the comparative sound volume adjustment operation unit 180 induces a user to adjust the sound volume of the comparative sound so as to be able to listen to the comparative sound and the reference sound at an identical sound volume.

The acoustic characteristic information generation unit 130, when it receives sound volume adjustment of the comparative sound via the comparative sound volume adjustment operation unit 180 (S105), mixes the comparative sound having an adjusted sound volume with the reference sound (S106). That is, the sound volume adjustment of a comparative sound is carried out in real time and a user can compare the sound volumes of the comparative sound and the reference sound instantly at the sound volume after adjusted. Consequently, the judgment of a sound volume is further facilitated.

The sound volume adjustment of the comparative sound is repeated until a user judges that the comparative sound and the reference sound are heard at an identical sound volume (S107). To that end, it is desirable to prepare an operator, an instruction screen, or the like in order for a user to show the finish of adjustment to the sound reproducing device 100.

When the sound volume adjustment of a comparative sound to be inspected finishes (S107: Yes), the acoustic characteristic information generation unit 130 records the sound volume adjustment result as the acoustic characteristic information data 140 in correspondence to the comparative sound to be inspected (S108). At this time, the adjustment result of a main sound volume may further be recorded in correspondence. At this time, since it is possible to obtain an auditory-perceptive acoustic characteristic for a main sound volume, it is possible to carry out frequency characteristic adjustment responding to a main sound volume in the music reproduction mode.

When another comparative sound exists, the processing from comparative sound setting (S103) to adjustment result recording (S108) is repeated until the processing is applied to all the comparative sounds (S109). As a result, it is possible to obtain the acoustic characteristic information data 140 in which a sound volume adjustment result for each comparative sound, namely for each frequency band, is recorded.

Here, it is also possible to reproduce a comparative sound already subjected to sound volume adjustment in the manner of being superimposed over a reference sound when the sound volume adjustment of another comparative sound is carried out. At this time, a sound produced by mixing a comparative sound already subjected to sound volume adjustment with a reference sound comes to be another reference sound and the reference sound is changed in response to the comparative sound. Otherwise, it is also possible to prepare plural reference sounds. For example, it is also possible to start from a comparative sound in a low-tone range and, in the inspection sequence of gradually shifting toward a comparative sound in a higher-tone range, a reference sound used for comparing it with the comparative sound also starts from a reference sound in a low-tone range and gradually shifts toward a reference sound in a higher-tone range. Since the level of a reference sound is already known, it is possible to carry out frequency characteristic adjustment even when a reference sound is changed.

In this way, by outputting a reference sound which a user can easily compare in conformity with a comparative sound, it is possible to carry out more appropriate sound volume adjustment.

The frequency characteristic adjustment unit 150 computes an auditory-perceptive acoustic characteristic on the basis of the acoustic characteristic information data 140 (S110), records equalization setting based on the auditory-perceptive acoustic characteristic (S111), and finishes the operation of the reproduced sound adjustment mode.

Operations in the music reproduction mode (S101: music reproduction) are explained hereunder. In the music reproduction mode too, the adjustment of a main sound volume is received by the main sound volume operation unit 170 (S112). Here, the adjustment of a main sound volume can be received at any time.

Then the designation of music to be reproduced is received from a user (S113). Further, equalization adjustment is received from a user (S114). The equalization adjustment can be carried out for example by: setting emphasis or reduction to a specific sound range; setting loudness, or selecting a frequency characteristic preset in accordance with a genre, a surrounding environment, etc.

Successively, the music sound source data 321 of the designated music are read from the storage medium 320 into the sound source data storage unit 110 and the reproduction processing unit 120 starts reproduction (S115). The frequency characteristic adjustment unit 150 carries out frequency characteristic adjustment to apply equalization adjustment received from a user to the reproduced sound on the basis of an acoustic characteristic computed in the reproduced sound adjustment mode (S116) and the sound output unit 160 outputs equalized sound data (S117). As a result, an equalized reproduced sound is output from the sound output device 200.

Here, when reproduced sound is adjusted in response to a main sound volume, frequency characteristic investigation is carried out on the basis of an acoustic characteristic responding to a main sound volume having received for adjustment at the processing of (S112).

As explained above, in the present embodiment, since a reference sound and a comparative sound are output simultaneously when reproduced sound is adjusted, a user can easily judge the sound volume of the comparative sound. Further, since it comes to be unnecessary for a user to comparatively listen to a reference sound and a comparative sound alternately, it is possible to reduce the time spent for adjustment operation of a reproduced sound.

In the present embodiment further, not electronic sounds but sounds of instruments are used as both a reference sound and a comparative sound. Consequently, it is possible to carry out sound volume adjustment of a comparative sound that has heretofore been likely to be dry and tasteless operation with a virtual feeling that mixing processing is worked on at a music production, such as recording, site. In particular, by reproducing a comparative sound already subjected to sound volume adjustment in the manner of being superimposed over a reference sound when the sound volume adjustment of a comparative sound to be inspected is carried out, it is possible to further strengthen the feeling of applying mixing processing.

In this way, it is possible to enhance the entertainment of reproduced sound adjustment operation and rouse the interest of a user. This inspires a user to positively work on reproduced sound adjustment operation and resultantly it is possible to provide a high quality reproduced sound excellent in an auditory-perceptive acoustic characteristic.

First Modified Example

The configuration of an acoustic characteristic information generation unit 130A according to the first modified example of the present embodiment is explained hereunder in reference to FIGS. 6A to 6C. As shown in FIG. 6A, in the present modified example, a sound volume adjustment unit 132L is installed for a left channel, a sound volume adjustment unit 132R is installed for a right channel, and a sound volume is selectively adjusted by the comparative sound volume adjustment operation unit 180. Which sound volume adjustment unit is to be used for the adjustment is selected by the control unit 131. Specifically, the sound volume adjustment unit in a channel where a comparative sound is input is used for the adjustment. In the present modified example further, a mixing unit is not installed, and the sound input through the right channel is output from the right channel and the sound input through the left channel is output from the left channel.

That is, in the present modified example, a comparative sound and a reference sound are input through a right channel and a left channel in sequence and both the adjustment of reproduced sound in the right channel and the adjustment of reproduced sound in the left channel are carried out. That is: reproduced sound in the right channel is adjusted by inputting a comparative sound through the right channel and a reference sound through the left channel simultaneously; and reproduced sound in the left channel is adjusted by inputting a comparative sound through the left channel and a reference sound through the right channel simultaneously.

In either of the cases, a user operates the comparative sound volume adjustment operation unit 180 so as to be able to listen to a comparative sound and a reference sound at an identical sound volume. By so doing, it is possible to carry out equalization based on an auditory-perceptive acoustic characteristic in a right channel and a left channel independently. In the present modified example here, since a comparative sound and a reference sound are not mixed and output through different channels, a comparative sound having a frequency band identical to the frequency band of a reference sound may be included.

At this time, the reference sound source data 311 and the comparative sound source data 312 can be treated as a file where a reference sound is recorded in a left channel and a comparative sound is recorded in a right channel and a file where a comparative sound is recorded in a left channel and a reference sound is recorded in a right channel. Further, plural comparative sounds may be recorded continuously in a file or may be partitioned by tracks.

When reproduced sound in the left channel is adjusted, as shown in FIG. 6B, the operational object of the comparative sound volume adjustment operation unit 180 is the sound volume adjustment unit 132L of the left channel and the sound volume adjustment unit 132R of the right channel is fixed to a reference value.

In the state, a comparative sound is input through the left channel and a reference sound is input through the right channel. Then, sound volume adjustment is applied to the comparative sound in the left channel with the sound volume adjustment unit 132L in accordance with the operation received by the comparative sound volume adjustment operation unit 180. The control unit 131 records the sound volume adjustment result as the acoustic characteristic information data 140. At this time, in addition to the comparative sound to be inspected, the information on a channel to be inspected is also recorded in correspondence.

When reproduced sound in the right channel is adjusted in contrast, as shown in FIG. 6C, the operational object of the comparative sound volume adjustment operation unit 180 is the sound volume adjustment unit 132R of the right channel and the sound volume adjustment unit 132L of the left channel is fixed to a reference value.

In this state, a comparative sound is input through the right channel and a reference sound is input through the left channel. Then, there is performed sound volume adjustment in accordance with the operation received by the comparative sound volume adjustment operation unit 180, through the use of the sound volume adjustment unit 132R for the comparative sound in the right channel. The control unit 131 records the sound volume adjustment result as the acoustic characteristic information data 140. At this time, in addition to the comparative sound to be inspected, the information on a channel to be inspected is also recorded in correspondence.

The control unit 131 determines a comparative sound to be inspected in sequence, inputs the comparative sound to be inspected through each of the right and left channels, and receives sound volume operation for the comparative sound to be inspected from a user for each of the right and left channels. At this time, it is desirable that the comparative sound volume adjustment operation unit 180 indicates the channel through which a comparative sound is output and induces a user to adjust the volume of the comparative sound so that the comparative sound and a reference sound may be heard at an identical volume in order to support the operation by the user.

Figure 7:
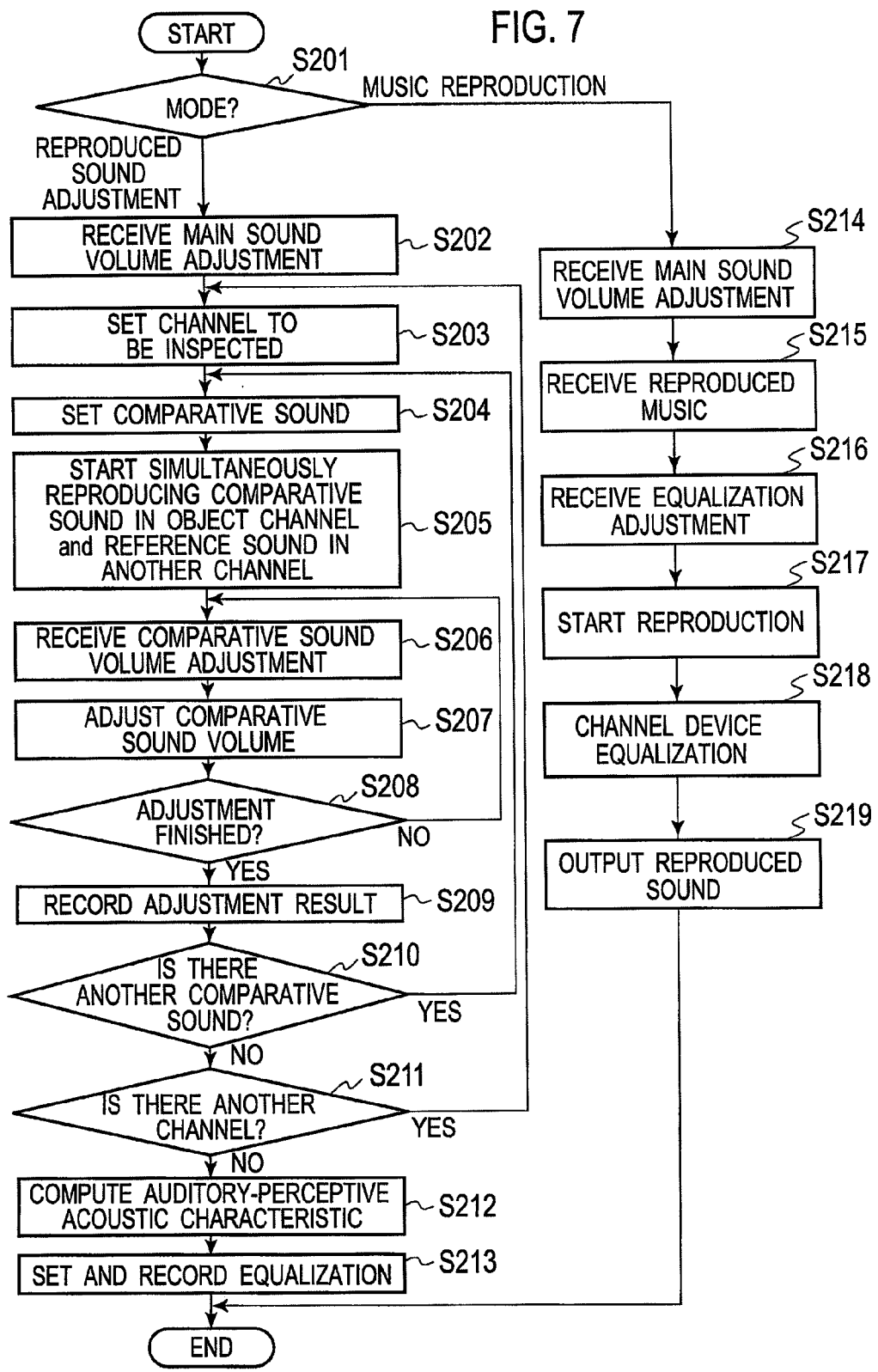
FIG. 7 is a flowchart explaining the operation of a sound reproducing device according to the first modified example of the first embodiment in the present invention.

Operations of the sound reproducing device 100 according to the first modified example of the present embodiment are explained hereunder in reference to FIG. 7. In FIG. 7, a reproduced sound adjustment mode and a music reproduction mode are explained separately. Explanations on the operations similar to those shown in FIG. 5 are abbreviated.

First, in the reproduced sound adjustment mode (S201: reproduced sound adjustment), the main sound volume operation unit 170 receives the adjustment of a main sound volume (S202).

Successively, the control unit 131 reads the reference sound source data 311 and the comparative sound source data 312 from the storage medium 310 into the sound source data storage unit 110 and sets a channel to be inspected in accordance with a predetermined sequence (S203). The inspection sequence can be the order of a left channel and then a right channel for example. Successively, a comparative sound to be inspected is set in accordance with the inspection sequence (S204).

When a channel and a comparative sound to be inspected are set, the reproduction processing unit 120: commences the reproduction of the reference sound source data 311 and the comparative sound source data 312 so that the comparative sound may be reproduced in the channel to be inspected and a reference sound may be reproduced in another channel; and outputs the reference sound and the comparative sound simultaneously (S205).

A user listens to the simultaneously reproduced sound and operates the comparative sound volume adjustment operation unit 180 so as to be able to listen to the comparative sound and the reference sound at an identical volume. In the present modified example too, a comparative sound and a reference sound are output simultaneously, and thus a user can easily judge the volume of the comparative sound.

The acoustic characteristic information generation unit 130, when it receives the sound volume adjustment of a comparative sound via the comparative sound volume adjustment operation unit 180 (S206), adjusts the sound volume at the channel to be inspected where the comparative sound is reproduced in accordance with operation contents (S207). The sound volume adjustment of the comparative sound is repeated until a user judges that the comparative sound and the reference sound are heard at an identical volume (S208).

When the sound volume adjustment of the comparative sound to be inspected in the channel to be inspected finishes (S208: Yes), the acoustic characteristic information generation unit 130 records the sound volume adjustment result as the acoustic characteristic information data 140 in correspondence to the channel and comparative sound to be inspected (S209).

When another comparative sound exists, the processing from the comparative sound setting (S204) to the adjustment result recording (S209) is repeated until the processing is performed on all the comparative sounds (S210). As a result, it is possible to obtain the acoustic characteristic information data 140 where the sound volume adjustment result is recorded for each comparative sound in each channel to be inspected, namely for each frequency band.

When the sound volume adjustment of all the comparative sounds is finished (S210: No), the processing after the setting of a channel to be inspected (S203) is repeated until the processing is performed on all the channels (S211).

When the sound volume adjustment of all the comparative sounds in all the channels is finished (S211: No), the frequency characteristic adjustment unit 150 computes an auditory-perceptive acoustic characteristic for each of the channels on the basis of the acoustic characteristic information data 140 (S212), records equalization setting based on the auditory-perceptive acoustic characteristic (S213), and finishes the operation of the reproduced sound adjustment mode.

Operations in a music reproduction mode (S201: music reproduction) are explained hereunder. In a music reproduction mode too, the main sound volume operation unit 170 receives the adjustment of a main sound volume (S214) and receives the designation of music to be reproduced (S215). Further, equalization adjustment is received from a user (S216).

Then, the sound source data storage unit 110 reads the music sound source data 321 of the designated music from the storage medium 320 and the reproduction processing unit 120 commences reproduction (S217). The frequency characteristic adjustment unit 150 carries out frequency characteristic adjustment to apply equalization adjustment received from a user to the reproduced sound on the basis of the acoustic characteristic computed in the reproduced sound adjustment mode for each channel (S218) and the sound output unit 160 outputs the equalized sound data (S219). As a result, a reproduced sound equalized for each channel is output from the sound output device 200.

In this way, in the present modified example too, since a reference sound and a comparative sound are output simultaneously when reproduced sound is adjusted, a user can easily judge the sound volume of the comparative sound. Further, since it comes to be unnecessary for a user to listen to a reference sound and a comparative sound alternately, it is possible to reduce the time spent for adjustment operation of reproduced sound.

Second Modified Example

Next, explanations will be given in the case where a sound reproducing device is compatible with a multichannel such as 5.1 channel. Meanwhile, 5.1 channel is only an example and a sound reproducing device compatible with another multichannel may also be included.

Figure 8:
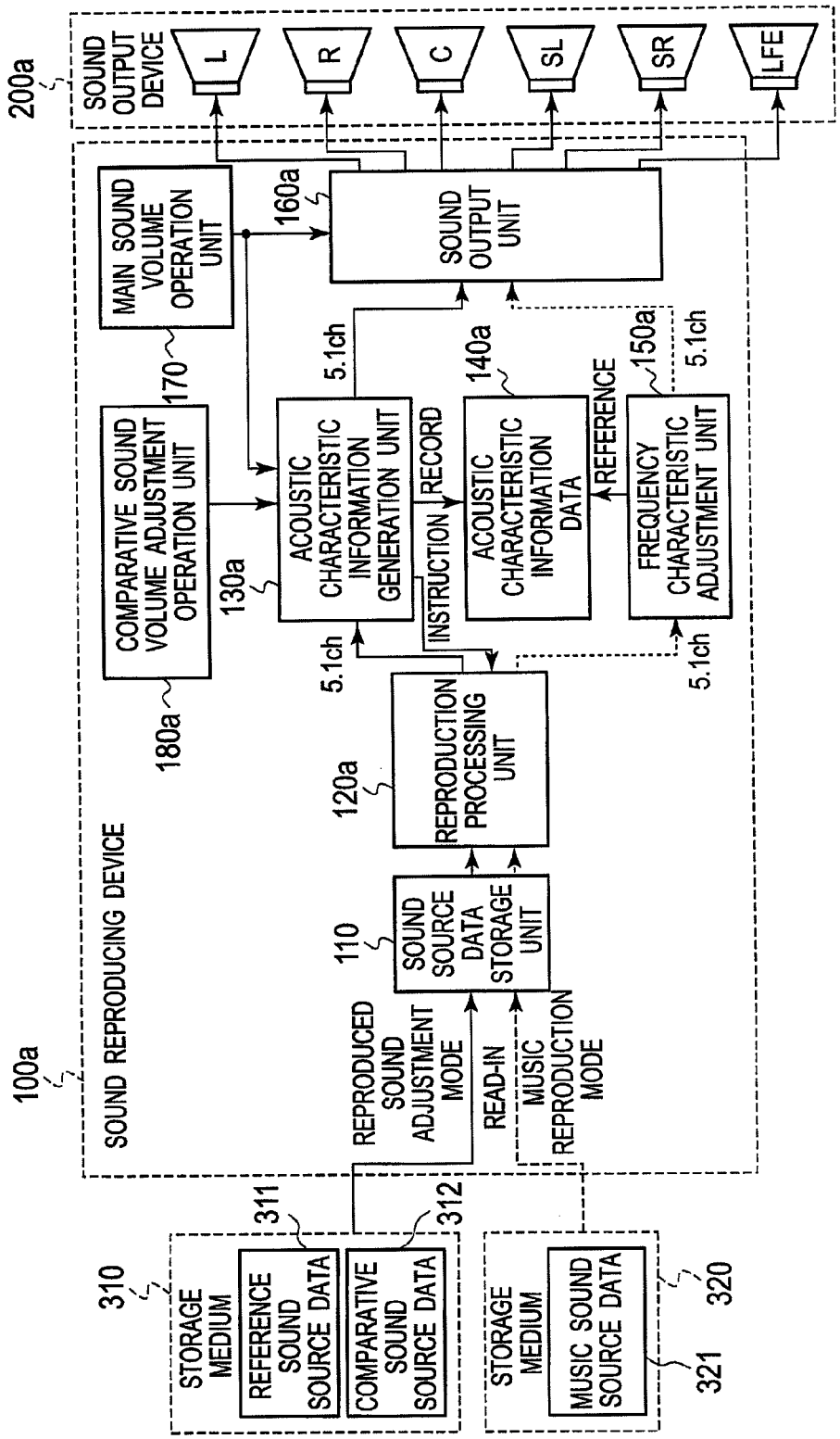
FIG. 8 is a block diagram showing the configuration of a sound reproducing device according to a second modified example of the first embodiment in the present invention.

FIG. 8 is a block diagram showing the configuration of a sound reproducing device according to the second modified example of the present embodiment. As shown in FIG. 8, a sound reproducing device 100a includes a reproduction processing unit 120a compatible with 5.1 channel, an acoustic characteristic information generation unit 130a, acoustic characteristic information data 140a, a frequency characteristic adjustment unit 150a, a sound output unit 160a, and a comparative sound volume adjustment operation unit 180a, and other blocks are the same as the blocks of the sound reproducing device 100 shown in FIG. 2. Furthermore, it is possible to use a sound output device 200a compatible with 5.1 channel as a sound output device. However, it is also possible to use a sound output unit of two channels.

Figure 9:
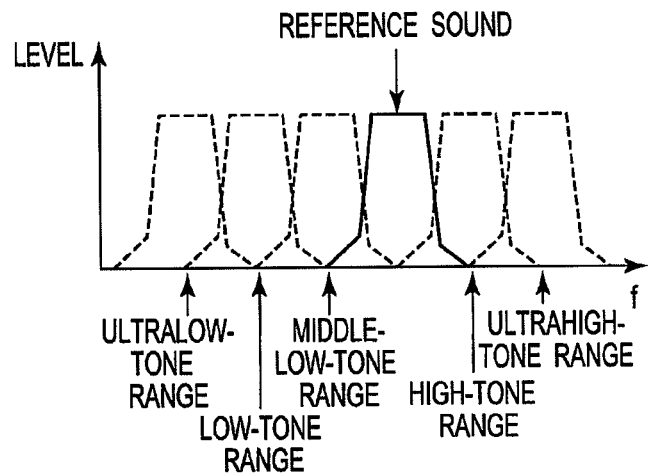
FIG. 9 is a view showing an example of the relationship between a reference sound and plural comparative sounds according to the second modified example of the first embodiment in the present invention.

In the present modified example, a reference sound and comparative sounds can be set in sound ranges shown in, for example, FIG. 9. That is, a sound range is divided into six ranges of an "ultralow-tone range", a "low-tone range", a "middle-low-tone range", a "middle-high-tone range", a "high-tone range", and an "ultrahigh-tone range", and the "middle-high-tone range" is used for the reference sound and the other sound ranges are used for comparative sounds.

Here, the reason why a sound range is divided into six ranges is to associate the six ranges with the six channels of 5.1 channels. Then, in the storage medium 310 such as a DVD or the like, a reference sound in the "middle-high-tone range" is recorded in a center channel (C-ch), a comparative sound in the "low-tone range" is recorded in a left channel (L-ch), a comparative sound in the "middle-low-tone range" is recorded in a right channel (R-ch), a comparative sound in the "high-tone range" is recorded in a surround left channel (SL-ch), a comparative sound in the "ultrahigh-tone range" is recorded in a surround right channel (SR-ch), and a comparative sound in the "ultralow-tone range" is recorded in a low-tone reinforcement channel (LFE: Low Frequency Effect).

In this case, for example, it is possible to use a sound of a bass drum as the comparative sound in the "ultralow-tone range", a sound of a base guitar as the comparative sound in the "low-tone range", a sound of a tenor sax as the comparative sound in the "middle-low-tone range", a vocal sound as the reference sound in the "middle-high-tone range", a sound of a flute as the comparative sound in the "high-tone range", and a sound of a cymbal as the comparative sound in the "ultrahigh-tone range". In this way, by using instrumental sounds corresponding to respective sound ranges as a reference sound and comparative sounds, it becomes possible to increase entertainment and carry out reproduced sound adjustment conforming to the listening preference and musicality of a user.

Furthermore, sounds having pitches constituting a consonant sound as a reference sound and comparative sounds may be output so as to make a chord by using the reference sound and the comparative sounds. It becomes possible to carry out adjustment reflecting the musicality of a user by carrying out sound volume adjustment in each sound range so that the vibrancy of a chord may have such a balance as to be heard comfortably. Also in this case, it is possible to carry out sound volume adjustment while a user listens to a deep and thick chord by reproducing a comparative sound already subjected to sound volume adjustment, in the manner of being superimposed over a reference sound. Moreover, it may also be possible to reproduce a comparative sound before subjected to sound volume adjustment, in the manner of being superimposed over a reference sound.

At this time, it is desirable to adopt a chord that does not generate a missing fundamental phenomenon in order not to cause an error particularly in carrying out sound volume adjustment in a low-tone range. Here, a missing fundamental phenomenon is the phenomenon of perceiving the pitch having a fundamental frequency not intended to exist when a harmonic series not including the fundamental frequency is heard and an example thereof is that, when a mixed sound of 100 Hz, 150 Hz, 200 Hz—is emitted, a sound in the vicinity of 50 Hz not included actually is perceived. By the phenomenon, a result of sound volume adjustment in a low-tone range may undesirably lose touch with intention of a user, and thus it is preferable to avoid a chord causing a missing fundamental phenomenon.

Meanwhile, with regard to a reference sound and comparative sounds, by recording them in the storage medium 310 by a widely-prevalent audio compression method such as Dolby AC3 (trademark), DtS (trademark), MPEG AAC (trademark), or the like, it is possible to use an existing device and secure versatility. Further, when a sound reproducing device is compatible with the number of channels not less than 5.1 channels, a sound range may be divided in response to the number of the channels.

Figure 10:
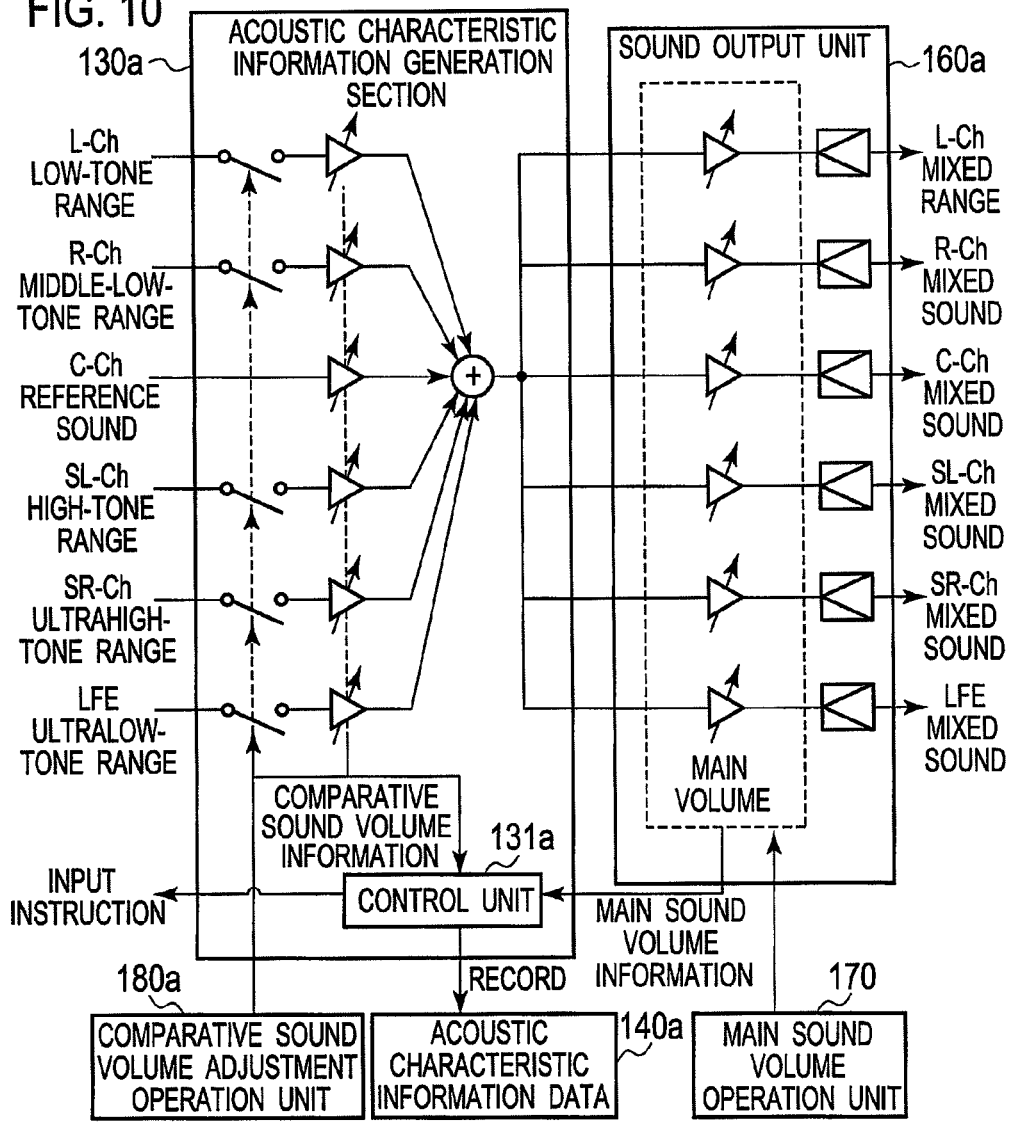
FIG. 10 is a block diagram explaining the configuration of an acoustic characteristic information generation unit according to the second modified example of the first embodiment in the present invention.

FIG. 10 is a block diagram showing an example of the configuration of the acoustic characteristic information generation unit 130a compatible with 5.1 channels. In FIG. 10, the comparative sound volume adjustment operation unit 180a can not only independently adjust the sound volumes of channels for outputting comparative sounds but also independently switch on and off the output. As a result, it is possible to: arbitrarily either adjust comparative sounds one by one or adjust plural comparative sounds while the plural comparative sounds are reproduced simultaneously like mixing; and obtain a sound required by a user more effectively in an enjoyable format.

Although the reproduced sounds of the channels are mixed and output from the respective channels in FIG. 10, it is also possible to output the independent reproduced sounds from the respective channels without mixing. At this time, the correspondence relationship between channels and sound ranges may be changeable. For example, although a comparative sound in a "low-tone range" is recorded in a left channel (L-ch) and a comparative sound in a "middle-low-tone range" is recorded in a right channel (R-ch) in the above example, it is also possible to reproduce a comparative sound in a "middle-low-tone range" from a left channel (L-ch) and a comparative sound in a "low-tone range" from a right channel (R-ch). By so doing, it is possible to equalize the variation of a frequency characteristic caused by a speaker and a surrounding environment.

Second Embodiment

Figure 11:
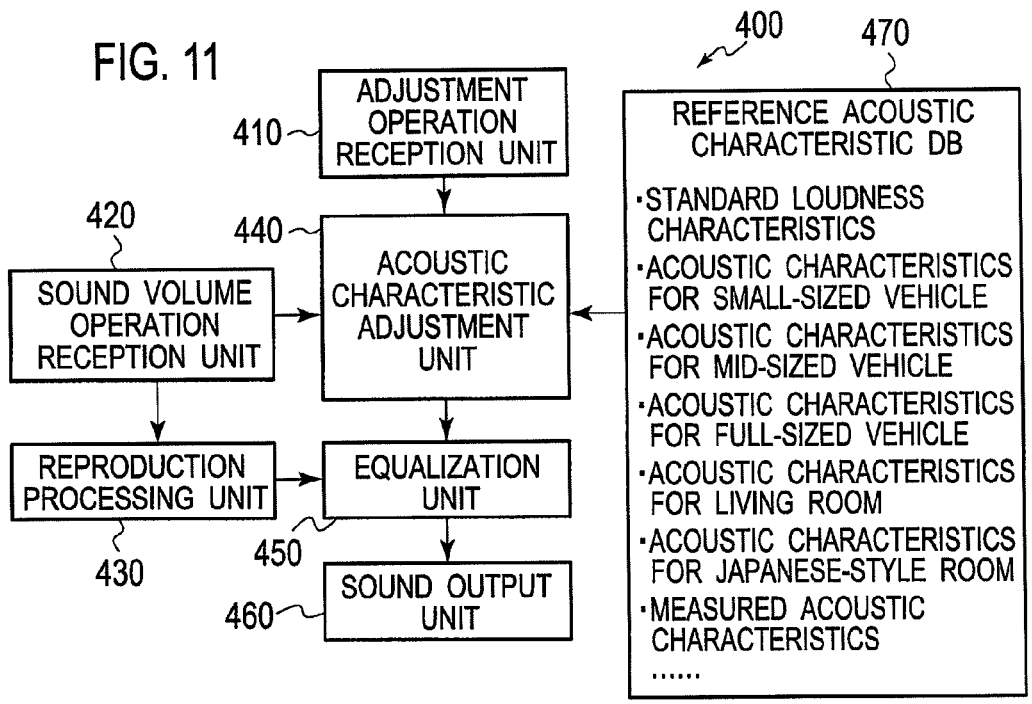
FIG. 11 is a block diagram showing an example of the configuration of an acoustic characteristic adjustment device according to a second embodiment in the present invention.

The second embodiment according to the present invention is explained in detail in reference to FIGS. 11 to 17. FIG. 11 is a block diagram showing an example of the configuration of an acoustic characteristic adjustment device according to the present embodiment. As shown in FIG. 11, an acoustic characteristic adjustment device 400 has an adjustment operation reception unit 410, a sound volume operation reception unit 420, a reproduction processing unit 430, an acoustic characteristic adjustment unit 440, an equalization unit 450, a sound output unit 460, and a reference acoustic characteristic DB (Data Base) 470. Such functional blocks may be realized either as hardware or as software.

The adjustment operation reception unit 410 carries out the processing of receiving the degree of the emphasis/reduction of a sound volume in each of a plurality of divided sound ranges from a user. A sound range can be divided into 5 ranges of a low-tone range, a middle-low-tone range, a middle-tone range, a middle-high-tone range, and a high-tone range for example. Further, the degree of emphasis/reduction can be set at a value of an integer between +10 and −10 with zero in the center for example.

The adjustment operation reception unit 410 can: shift to an acoustic characteristic adjustment mode on the basis of instructions by a user; display the divided plural sound ranges and adjustment values on a display device (not shown in the figure) such as a liquid crystal panel; and receive an adjustment value in each of the sound ranges by operating a dial, a button, a touch panel, or the like for example. Here, the number of divided sound ranges is not limited to 5 ranges of a low-tone range, a middle-low-tone range, a middle-tone range, a middle-high-tone range, and a high-tone range and the degree of emphasis/reduction is not limited to the range of +10 to −10.

The sound volume operation reception unit 420 receives the sound volume adjustment operation of a reproduced sound from a user. Sound volume adjustment can be received by the operation of a dial, a button, or the like for example. The reproduction processing unit 430 carries out the reproduction processing of a sound source designated by a user. The type of the sound source is not limited and various sound sources such as audio inputs from a CD, a radio, an audio file, and an external sound device can be used.

The equalization unit 450 applies equalization processing to a sound reproduced by the reproduction processing unit 430 on the basis of the setting of the acoustic characteristic adjustment unit 440. The equalization unit 450 can adjust an acoustic characteristic for a frequency band corresponding to a divided sound range in the adjustment operation reception unit 410. For example, when the adjustment operation reception unit 410 can receive adjustment in each of a low-tone range, a middle-low-tone range, a middle-tone range, a middle-high-tone range, and a high-tone range, the acoustic characteristic can be adjusted for each of the low-tone range, the middle-low-tone range, the middle-tone range, the middle-high-tone range, and the high-tone range. The equalization unit 450 can comprise a DSP (Digital Signal Processor) for example.

The sound output unit 460 outputs a reproduced sound output by the reproduction processing unit 430 and equalized by the equalization unit 450 as a sound. The sound output unit 460 can comprise an amplifier and a speaker for example.

The reference acoustic characteristic DB 470 is databases storing reference acoustic characteristics being referred to when the acoustic characteristic adjustment unit 440 computes an adjustment value of an acoustic characteristic. The reference acoustic characteristics: can be acoustic characteristics responding to a reproduction environment, standard characteristics of loudness, or the like; and are characteristics showing the balance of emphasis/reduction in each sound range. In the reference acoustic characteristic DB 470, when the acoustic characteristic adjustment device 400 is an in-vehicle device for example, characteristic data appropriate for the size and the shape of a vehicle on which the acoustic characteristic adjustment device 400 is mounted, such as acoustic characteristics for a small-sized vehicle appropriate for the reproduction in a small-sized vehicle or acoustic characteristics for a full-sized vehicle appropriate for the reproduction in a full-sized vehicle, are stored. When the acoustic characteristic adjustment device 400 is a stationary type, acoustic characteristics for living room appropriate for reproduction in a living room, acoustic characteristics for a Japanese-style room appropriate for the reproduction in a Japanese-style room, and the like are stored. Here, the number and types of reference acoustic characteristics stored in the reference acoustic characteristic DB 470 is arbitrary and may be single.

Although already obtained standard characteristics are recorded as such reference acoustic characteristics, it is also possible to include acoustic characteristics collected in an actual reproduction environment with an acoustic characteristic measurement device or the like ("measured acoustic characteristics" in FIG. 11). At this time, it is also possible to grant an acoustic characteristic measurement function to the acoustic characteristic adjustment device 400 itself.

Figure 12:
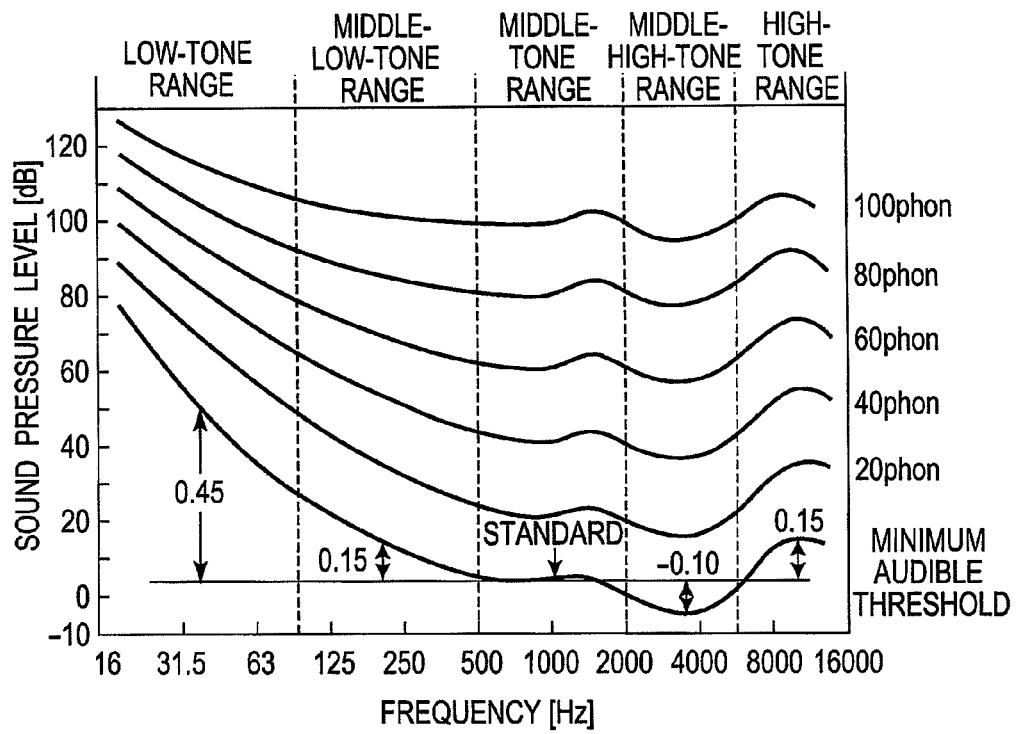
FIG. 12 is a view showing a standard characteristic of loudness according to the second embodiment in the present invention.

FIG. 12 shows a standard characteristic of loudness as one of reference acoustic characteristics. That is, a sound pressure level that is heard as a sound volume identical to a sound volume at a frequency of 1,000 Hz is plotted for each of frequencies in the figure. The audibility of a low-tone range and a high-tone range changes in response to a sound volume, and thus characteristics of loudness are determined for each sound volume at a frequency of 1,000 Hz.

In the present embodiment, with regard to a reference acoustic characteristic such as a characteristic of loudness, difference of a sound pressure level in a sound range from a sound pressure level in another sound range is used as a coefficient for each sound range. For example, when attention is paid to a middle-tone range in a curve of a minimum audible threshold, the coefficient of a low-tone range to the middle-tone range is set at 0.45, the coefficient of a middle-low-tone range at 0.15, the coefficient of a middle-high-tone range at −0.10, and the coefficient of a high-tone range at 0.15. Those coefficient values are set, in the curve of the minimum audible threshold, as values proportional to the differences of the sound pressure levels in the low-tone range (a frequency of about 63 Hz: 2 octaves lower than the middle-low-tone range), the middle-low-tone range (a frequency of about 250 Hz: 2 octaves lower than the middle-tone range), the middle-high-tone range (a frequency of about 4,000 Hz: 2 octaves higher than the middle-tone range), and the high-tone range (a frequency of about 16,000 Hz: 2 octaves higher than the middle-high-tone range) to the sound pressure level in the middle-tone range (a frequency of 1,000 Hz). Also with regard to an acoustic characteristic other than characteristics of loudness, discrete coefficient values can be set likewise.

By setting those coefficients in the low-tone range, the middle-low-tone range, the middle-high-tone range, and the high-tone range respectively in the curve of the minimum audible threshold, the table shown in FIG. 13 is obtained. In the low-tone range for example, the sound pressure level that can be heard as an identical sound volume is higher than other sound ranges in characteristics of loudness. Consequently, minus coefficients are set to all the other sound ranges. In the reference acoustic characteristic DB 470, such relative coefficients in the respective sound ranges may be recorded with regard to each of acoustic characteristics.

The acoustic characteristic adjustment unit 440 computes an adjustment value in each of the sound ranges by using an acoustic characteristic adjustment value based on instructions by a user and any of the reference acoustic characteristics stored in the reference acoustic characteristic DB 470. Here, an adjustment value in a certain sound range is represented by an adjustment value (n), the subscripts n showing a low-tone range, a middle-low-tone range, a middle-tone range, a middle-high-tone range, and a high-tone range are represented by 1, 2, 3, 4, and 5, and thus the adjustment value in the low-tone range is set at an adjustment value (1), the adjustment value in the middle-low-tone range at an adjustment value (2), the adjustment value in the middle-tone range at an adjustment value (3), the adjustment value in the middle-high-tone range at an adjustment value (4), and the adjustment value in the high-tone range at an adjustment value (5). In another item too, a subscript n represents a sound range likewise.

In the present embodiment, an adjustment value (n) is computed in accordance with [Formula 1]. A fraction can be treated by rounding for example in the following expression.

Adjustment value(*n*)={Operation adjustment term(*n*)+ Average difference term(*n*)+Reference acoustic characteristic term(*n*)}×Adjustment result weight value *I*(*n*)     [Formula 1]

Here, the operation adjustment term (n), the average difference term (n), and the reference acoustic characteristic term (n) in [Formula 1] are computed in accordance with [Formula 2], [Formula 3], and [Formula 4], respectively.

Operation adjustment term(*n*)=Operation adjustment value *M*(*n*)×Operation value weight value *A*(*n*)     [Formula 2]

Here, the operation adjustment value M(n) is an adjustment value received by user operation in a sound range (n).

Average difference term(*n*)=(Operation adjustment value *M*(*n*)−Operation adjustment value average *Av*)×Average difference weight value *B*(*n*)     [Formula 3]

Here, $$Av = \frac{1}{m}\sum_{n=1}^{m}$$

Operation adjustment value M(n)
m: sound range partition number

Reference acoustic characteristic term(*n*)={(Operation adjustment value *M*(*n*)−Operation adjustment value *M*(1))×Reference characteristic difference coefficient *C*(*n*)+(Operation adjustment value *M*(*n*)−Operation adjustment value *M*(2))×Reference characteristic difference coefficient *D*(*n*)+ (Operation adjustment value *M*(*n*)−Operation adjustment value *M*(3))×Reference characteristic difference coefficient *E*(*n*)+(Operation adjustment value *M*(*n*)−Operation adjustment value *M*(4))×Reference characteristic difference coefficient *F*(*n*)+(Operation adjustment value *M*(*n*)− Operation adjustment value *M*(5))×Reference characteristic difference coefficient *G*(*n*)}×Reference characteristic weight value *H*(*n*)     [Formula 4]

That is, an adjustment value (n) in a certain sound range (n) is computed from: an operation adjustment term (n) obtained on the basis of an operation adjustment value M(n) received by user operation in the sound range (n); an average difference term (n) obtained on the basis of the difference between the operation adjustment value M(n) in the sound range (n) and the average value Av of the operation adjustment values in all the sound ranges; and a reference acoustic characteristic term (n) obtained on the basis of the sum of the values, each of which is obtained by multiplying the difference between the operation adjustment value M(n) in the sound range and each of the operation adjustment values in other sound ranges by each of the difference coefficients (C(n), D(n), E(n), F(n), and G(n)) obtained from a prescribed reference acoustic characteristic.

More specifically, an operation adjustment term (n) is computed by multiplying an operation adjustment value M(n) in the sound range (n) by an operation value weight value A(n). An average difference term (n) is computed by multiplying the difference between an operation adjustment value M(n) in the sound range (n) and the average value Av of the operation adjustment values in all the sound ranges by an average difference weight value B(n). A reference acoustic characteristic term (n) is computed by multiplying the sum of the values, each of which is obtained by multiplying the difference between an operation adjustment value M(n) in the sound range (n) and an operation adjustment value in each of the other sound ranges by each of the difference coefficients (C(n), D(n), E(n), F(n), and G(n)) obtained from a reference acoustic characteristic, by a reference characteristic weight value H(n).

An operation value weight value A(n) is a parameter representing the degree of emphasis placed on an operation adjustment value M(n) that is an adjustment value by a user. An average difference weight value B(n) is a weight value by which the difference between an operation adjustment value M(n) in the sound range (n) and the average value Av of the operation adjustment values M(n) is multiplied, and thus, as the value increases, the variation of the adjustment values reduces.

A reference characteristic weight value H(n) is a weight value by which the sum of the values, each of which is the product of the difference between an operation adjustment values M(n) in the sound range (n) and each of operation adjustment values in other sound ranges and the difference coefficient of a reference acoustic characteristic in the sound range (n), is multiplied, and thus, as the value increases, the variation of the adjustment values reduces and the adjustment value (n) comes close to the reference acoustic characteristic.

That is, by setting an operation value weight value A(n), an average difference weight value B(n), and a reference characteristic weight value H(n), it becomes possible to adjust which item of adjustment values by user operation, the variation control of adjustment values by user operation, and a reference acoustic characteristic tendency is emphasized.

As the parameters included in [Formula 1], [Formula 2], [Formula 3], and [Formula 4], the values shown in FIG. 14 can be used for example. Here, each of an operation value weight value A(n), an average difference weight value B(n), and a reference characteristic weight value H(n) is set at an identical value over the sound ranges. Thus the operation value weight value A(n) is set at 0.40, the average difference weight value B(n) at 0.40, and the reference characteristic weight value H(n) at 0.20 so that the sum of them in each sound range becomes 1 (100%). It is a matter of course that those values can be changed depending on an item on which an emphasis is placed.

Furthermore, as the reference characteristic difference coefficients of C(n), D(n), E(n), F(n), and G(n), the coefficients of characteristic of loudness shown in FIG. 13 are used. However, since FIG. 13 shows values to be emphasized and FIG. 14 shows values to emphasize, the signs are reversed.

An adjustment result weight value I(n) for carrying out the whole adjustment is set to 1.00 in all the sound ranges. The adjustment result weight value I(n) can be set at a value for adjusting the sum to one when the sum of an operation value weight value A(n), an average difference weight value B(n), and a reference characteristic weight value H(n) deviates from one.

By adjusting an adjustment value based on user operation with parameters shown in FIG. 14, the adjustment value based on user operation comes close to an average value and also is adjusted to a value closer to a characteristic of loudness at an intensity responding to weight values.

Figure 15A:
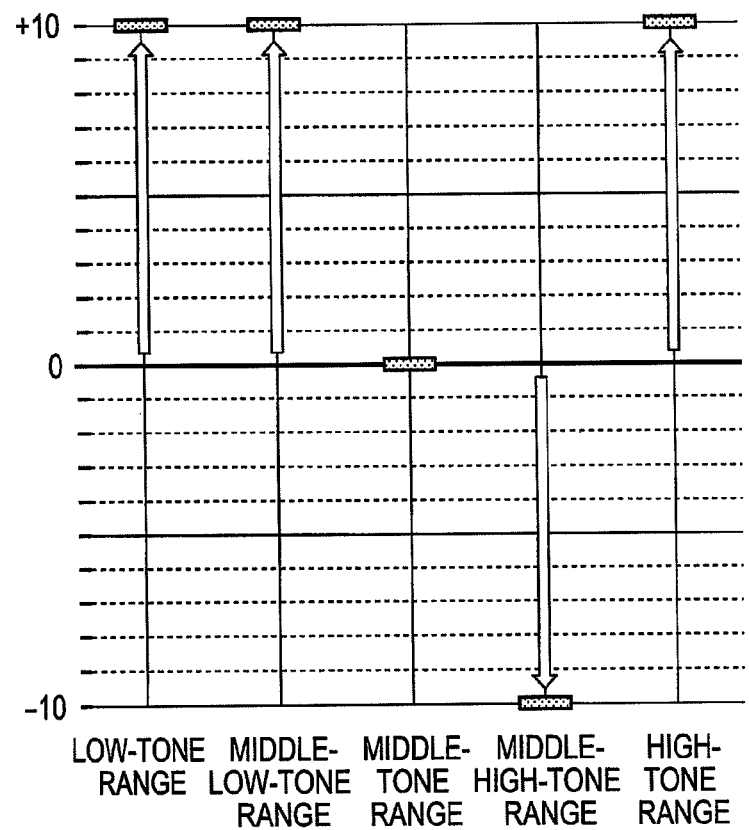
FIGS. 15A and 15B are views showing the relationship between an adjustment result example based on user operation and a frequency characteristic of reproduced sound based on the adjustment result according to the second embodiment in the present invention.
Figure 15B:
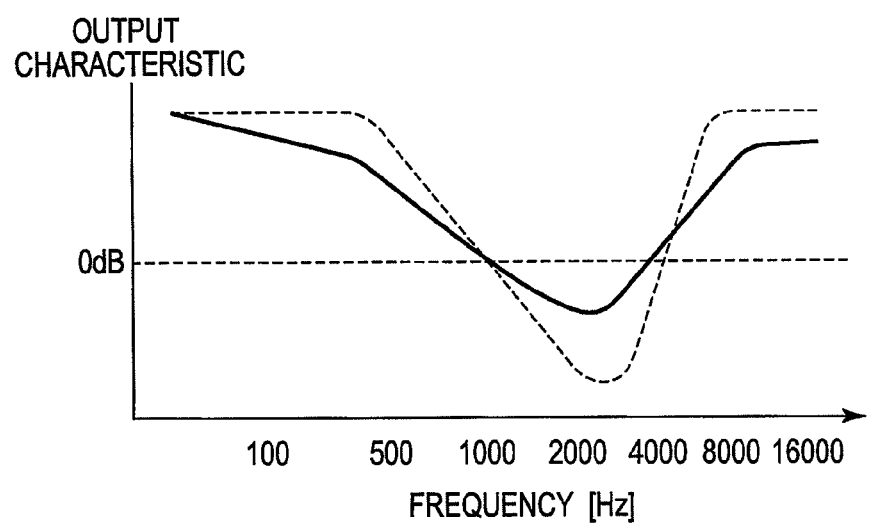

Even when the adjustment values based on user operation vary largely like low-tone range: +10, middle-low-tone range: +10, middle-tone range: 0, middle-high-tone range: −10, and high-tone range +10 as shown in FIG. 15A for example, as a result of the adjustment, the adjustment value in the low-tone range is +10, the adjustment value in the middle-low-tone range +8, the adjustment value in the middle-tone range 0, the adjustment value in the middle-high-tone range −5, and the adjustment value in the high-tone range +8 and a reproduced sound having the frequency characteristic shown with the solid line in FIG. 15B is obtained. Consequently, it is possible to obtain a good reproduction result that is natural and does not hinder musicality in comparison with a reproduced sound having conventional frequency characteristic shown with the broken line.

Acoustic characteristic adjustment procedures of an acoustic characteristic adjustment device 400 are explained hereunder in reference to FIG. 16. An acoustic characteristic adjustment device 400 shifts toward an acoustic characteristic adjustment mode on the basis of instructions by a user (S301). That is, a user may shift the acoustic characteristic adjustment device 400 to an acoustic characteristic adjustment mode by a prescribed operation when the user wants to adjust an acoustic characteristic.

In the acoustic characteristic adjustment mode, operation of acoustic characteristic adjustment is received from a user via the adjustment operation reception unit 410 (S302). The user sets an adjustment value in each of divided plural sound ranges arbitrarily or while the user listens to a reference sound and a comparative sound for adjustment support.

When adjustment operation reception from a user is finished, the acoustic characteristic adjustment unit 440 selects a reference acoustic characteristic to be used for adjustment from among reference acoustic characteristics stored in the reference acoustic characteristic DB 470 (S303). It is also possible to select a reference acoustic characteristic on the basis of the designation of a user or select a reference acoustic characteristic predetermined in accordance with a reproduction environment and the like. For example, it is also possible to select a characteristic of loudness as a reference acoustic characteristic of default. Otherwise, it is also possible to select an acoustic characteristic actually measured in a reproduction environment. When a reference acoustic characteristic to be used for adjustment is selected, the reference characteristic difference coefficients (C(n), D(n), E(n), F(n), and G(n)) shown in FIG. 14 are determined.

Next, the acoustic characteristic adjustment unit 440 sets the respective weight values of an operation value weight value A(n), an average difference weight value B(n), and a Reference characteristic weight value H(n) (S304). It may also be possible to set those weight values either as fixed values or on the basis of the designation by a user. Furthermore, it may also be possible to associate a reference acoustic characteristic with weight values beforehand and set the weight values in conjunction with the selected reference acoustic characteristic.

Then, the acoustic characteristic adjustment unit 440 computes an adjustment value in each of the sound ranges by using an acoustic characteristic adjustment value based on user operation, the reference characteristic difference coefficients of a selected reference acoustic characteristic, and set weight values (S305). An adjustment value can be computed in accordance with [Formula 1], [Formula 2], [Formula 3], and [Formula 4] stated above. At this time, it is also possible to set an upper limit and a lower limit to an adjustment value. For example, when an adjustment value by operation is received in the range of +10 to −10, a computed adjustment value may also be clipped so as to be within the range of +10 to −10.

When an adjustment value in each of the sound ranges is computed, the acoustic characteristic adjustment unit 440 sets the computed adjustment values in the equalization unit 450 (S306). In the succeeding reproduction, the acoustic characteristic of the sound reproduced by the reproduction processing unit 430 are adjusted in the equalization unit 450 where computed adjustment values are set and the reproduced sound is output from the sound output unit 460. In this way, it is possible to obtain a reproduced sound having a good acoustic characteristic while the adjustment result of acoustic characteristic adjustment received by user operation is taken into consideration.

Figure 17:
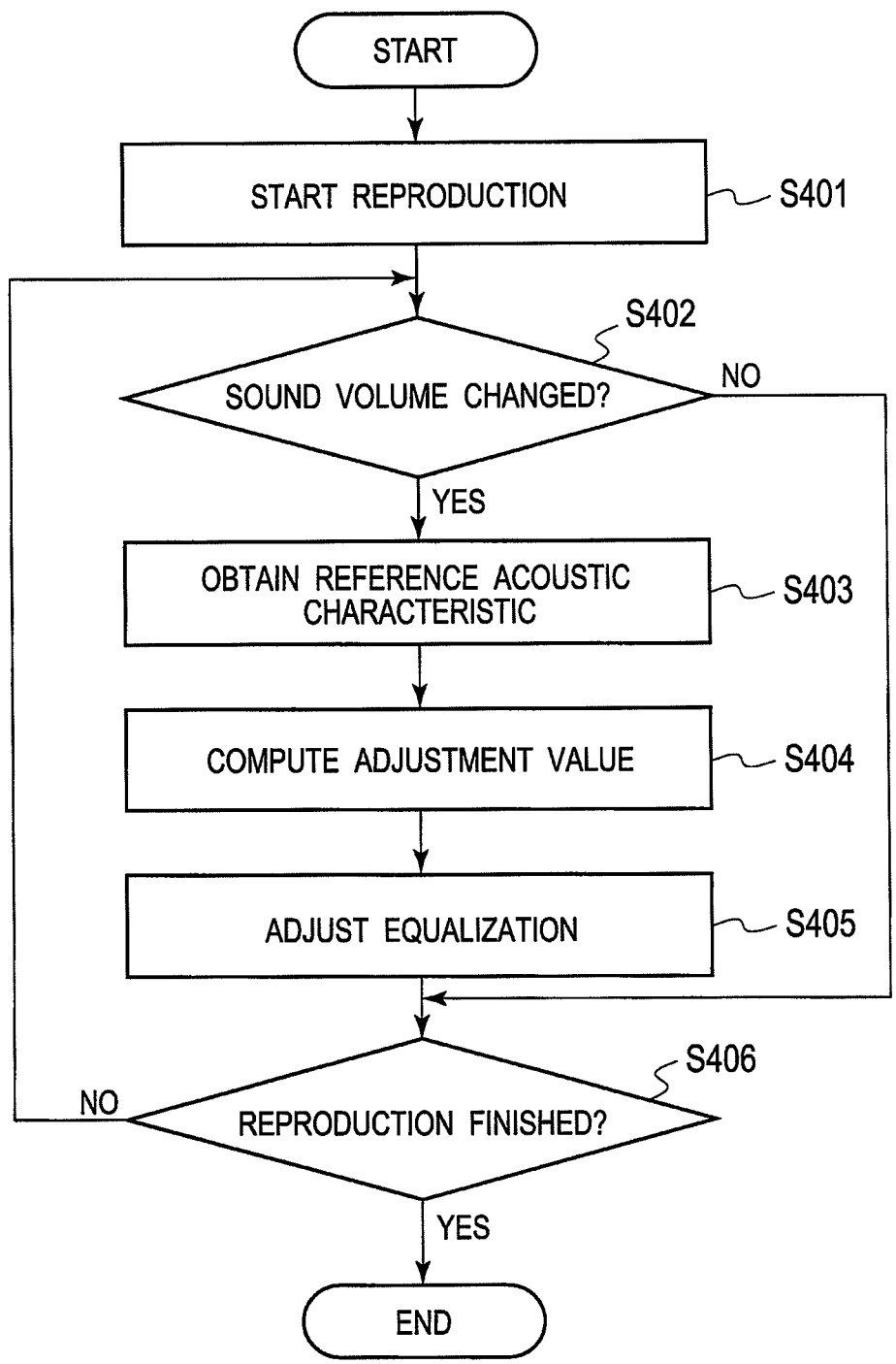
FIG. 17 is a flowchart showing procedures when an adjustment value is changed in response to a sound volume according to the second embodiment in the present invention.

Here, when a reference acoustic characteristic by which a coefficient is changed in response to a sound volume like in the case of characteristic of loudness shown in FIG. 12 is selected as a reference acoustic characteristic, it is also possible to change an adjustment value in response to a sound volume during reproduction. FIG. 17 is a flowchart showing the procedures in the case of changing an adjustment value in response to a sound volume.

When the reproduction processing unit 430 of the acoustic characteristic adjustment device 400 starts reproduction (S401), the equalization unit 450 carries out acoustic characteristic adjustment using adjustment values set through the procedures shown in FIG. 16 and the sound output unit 460 outputs sound.

When sound volume is changed via the sound volume operation reception unit 420 during reproduction (S402: Yes), the acoustic characteristic adjustment unit 440 obtains a reference acoustic characteristic responding to the changed sound volume from the reference acoustic characteristic DB 470 (S403). However, the type of the obtained reference acoustic characteristic is identical to the type before the change.

For example, when the reference acoustic characteristic selected in the processing (S403) is a characteristic of loudness, a reference acoustic characteristic responding to the sound volume after change in the characteristic of loudness is obtained. Meanwhile, when the reference acoustic characteristic selected at the processing (S403) is a reference acoustic characteristic not changing a coefficient in response to a sound volume, the processing of changing an adjustment value in response to a sound volume is unnecessary.

Then, an adjustment value is computed for each of the sound ranges through procedures similar to the processing (S305) on the basis of the obtained reference acoustic characteristic (S404). Meanwhile, already set weight values (an operation value weight value A(n), an average difference weight value B(n), and a reference characteristic weight value H(n)) can be used as they are, and thus it is not necessary to change them.

When an adjustment value for each of the sound ranges is computed, the acoustic characteristic adjustment unit 440 adjusts the equalization unit 450 by the computed adjustment values (S405). In the succeeding reproduction, the acoustic characteristic of the sound reproduced by the reproduction processing unit 430 are adjusted in the equalization unit 450 on the basis of the changed adjustment values and the reproduced sound is output from the sound output device 460.

By repeating the above processing until the reproduction is finished (S406), it is possible to obtain a reproduced sound using adjustment values responding to changed sound volumes and having a good acoustic characteristic.

What is claimed is:

1. A sound reproducing device comprising:
a sound source data storage unit configured to store reference sound source data for reproducing a reference sound having a prescribed frequency band and comparative sound source data for reproducing comparative sounds having frequency bands different from each other;

a reproduction processing unit configured to reproduce the reference sound and the comparative sounds on the basis of the reference sound source data and the comparative sound source data stored in the sound source data storage unit;

a comparative sound volume adjustment operation unit configured to receive sound volume adjustment operation for the comparative sounds; and an acoustic characteristic information generation unit configured to simultaneously output the reference sound and a comparative sound of a sound volume in accordance with the received sound volume adjustment operation and record a result of the sound volume adjustment operation in association with the comparative sound related to reproduction.

2. The sound reproducing device according to claim 1, wherein the reference sound source data and the comparative sound source data are reproduced in parallel at different channels in the reproduction processing unit.

3. The sound reproducing device according to claim 1, wherein the acoustic characteristic information generation unit mixes and outputs the reference sound and the comparative sounds.

4. The sound reproducing device according to claim 3, wherein the acoustic characteristic information generation unit outputs mixed sound formed by mixing the reference sound and the comparative sounds, to a plurality of channels.

5. The sound reproducing device according to claim 1, further comprising a main sound volume operation unit configured to receive main sound volume adjustment operation for changing sound volumes of the reference sound and the comparative sounds in conjunction with each other, wherein
the acoustic characteristic information generation unit records the result of the sound volume adjustment operation for the comparative sound further in association with a result of the main sound volume adjustment operation.

6. The sound reproducing device according to claim 1, further comprising a frequency characteristic adjustment unit configured to compute an auditory-perceptive acoustic characteristic on the basis of the result of the sound volume adjustment operation associated with a plurality of comparative sounds.

7. The sound reproducing device according to claim 6, wherein:
the sound source data storage unit further stores music sound source data for reproducing music;
the reproduction processing unit reproduces music on the basis of the music sound source data stored in the sound source data storage unit; and
the frequency characteristic adjustment unit changes a frequency characteristic of reproduced sound on the basis of the computed auditory-perceptive acoustic characteristic, when the music is reproduced.

8. The sound reproducing device according to claim 1, wherein the frequency band of each of the comparative sounds is narrower than the frequency band of the reference sound.

9. The sound reproducing device according to claim 1, wherein the comparative sounds and the reference sound are instrumental sounds.

10. The sound reproducing device according to claim 1, wherein each of the comparative sounds and the reference sound has a pitch constituting a consonant sound.

11. The sound reproducing device according to claim 10, wherein the pitches of the comparative sounds and the reference sound are determined so as not to form a harmonic series not including a fundamental frequency.

12. The sound reproducing device according to claim 1, wherein the sound source data storage unit stores the reference sound source data and the comparative sound source data, as separate channel sounds in an identical track.

13. The sound reproducing device according to claim 12, wherein the comparative sound volume adjustment operation unit can independently switch on and off outputs of the separate channel sounds.

14. The sound reproducing device according to claim 1, wherein the reproduction processing unit reproduces a different reference sound in response to the comparative sounds.

15. A reproduced sound adjustment method in a sound reproducing device comprising:
a sound source data storage step of storing reference sound source data for reproducing a reference sound having a prescribed frequency band and comparative sound source data for reproducing comparative sounds having frequency bands different from each other;

a reproduction processing step of reproducing the reference sound and the comparative sounds;

a comparative sound volume adjustment operation step of receiving sound volume adjustment operation for the comparative sounds; and an acoustic characteristic information generation step of simultaneously outputting the reference sound and a comparative sound having a sound volume in accordance with the received sound volume adjustment operation and recording a result of the sound volume adjustment operation in association with the comparative sound related to reproduction.

* * * * *